US011430790B2

(12) United States Patent
More

(10) Patent No.: US 11,430,790 B2
(45) Date of Patent: Aug. 30, 2022

(54) SEMICONDUCTOR DEVICE AND METHOD

(71) Applicant: Taiwan Semiconductor Manufacturing Co., Ltd., Hsinchu (TW)

(72) Inventor: Shahaji B. More, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 8 days.

(21) Appl. No.: 17/160,848

(22) Filed: Jan. 28, 2021

(65) Prior Publication Data

US 2022/0052043 A1 Feb. 17, 2022

Related U.S. Application Data

(60) Provisional application No. 63/082,541, filed on Sep. 24, 2020, provisional application No. 63/065,575, filed on Aug. 14, 2020.

(51) Int. Cl.
*H01L 27/092* (2006.01)
*H01L 29/06* (2006.01)
*H01L 29/78* (2006.01)
*H01L 21/8234* (2006.01)
*H01L 29/66* (2006.01)

(52) U.S. Cl.
CPC .. *H01L 27/0924* (2013.01); *H01L 21/823418* (2013.01); *H01L 21/823431* (2013.01); *H01L 21/823468* (2013.01); *H01L 29/0653* (2013.01); *H01L 29/6656* (2013.01); *H01L 29/66795* (2013.01); *H01L 29/7851* (2013.01)

(58) Field of Classification Search
CPC ......... H01L 27/0924; H01L 21/823418; H01L 21/823431; H01L 21/823468; H01L 29/0653; H01L 29/6656; H01L 29/66795; H01L 29/7851; H01L 29/66545; H01L 29/7848
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |

(Continued)

FOREIGN PATENT DOCUMENTS

| | | |
|---|---|---|
| TW | 201830498 A | 8/2018 |
| TW | 201923841 A | 6/2019 |

*Primary Examiner* — Karen Kusumakar
*Assistant Examiner* — Adam S Bowen
(74) *Attorney, Agent, or Firm* — Slater Matsil, LLP

(57) ABSTRACT

An embodiment device includes: an isolation region on a substrate; a first fin extending above a top surface of the isolation region; a gate structure on the first fin; and an epitaxial source/drain region adjacent the gate structure, the epitaxial source/drain region having a first main portion and a first projecting portion, the first main portion disposed in the first fin, the first projecting portion disposed on a first sidewall of the first fin and beneath the top surface of the isolation region.

20 Claims, 20 Drawing Sheets

(56) References Cited

U.S. PATENT DOCUMENTS

| | | |
|---|---|---|
| 9,831,183 B2 | 11/2017 | Lin et al. |
| 9,859,386 B2 | 1/2018 | Ho et al. |
| 2018/0151703 A1 | 5/2018 | Lin et al. |
| 2018/0175046 A1* | 6/2018 | Chiou .................. H01L 29/165 |
| 2019/0148551 A1 | 5/2019 | More et al. |

* cited by examiner

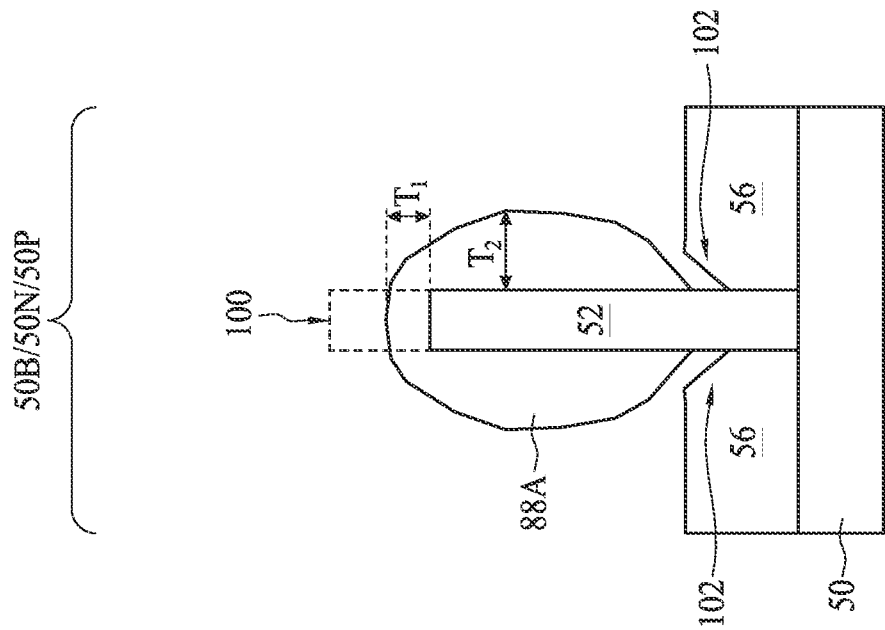
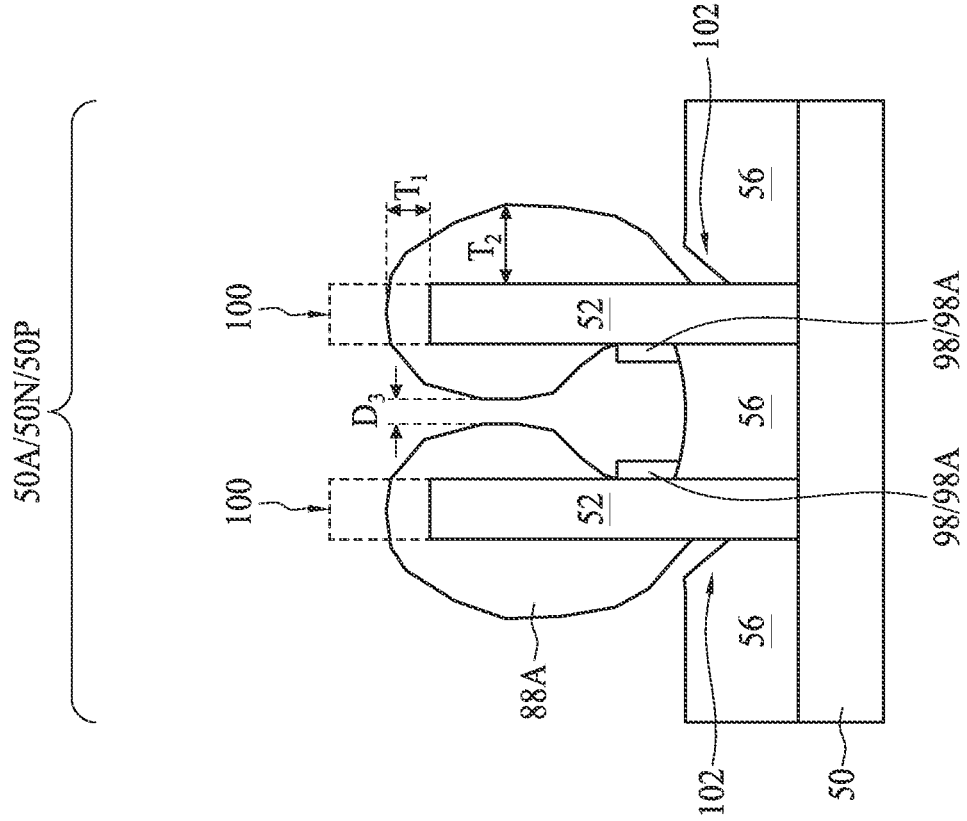

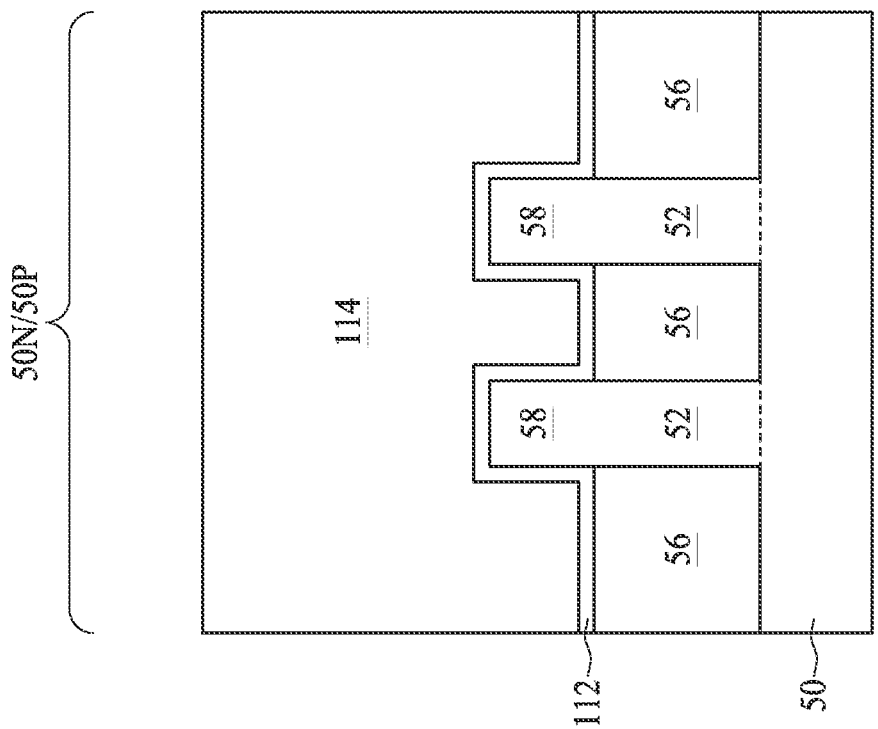
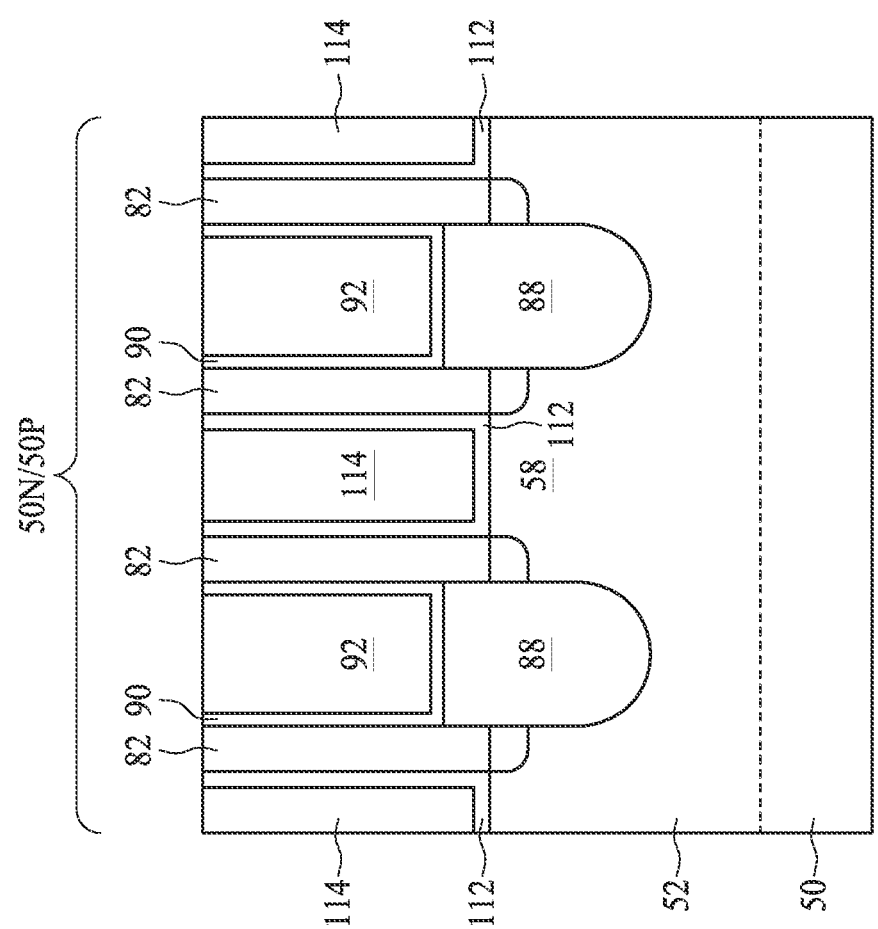
FIG. 15B
FIG. 15A

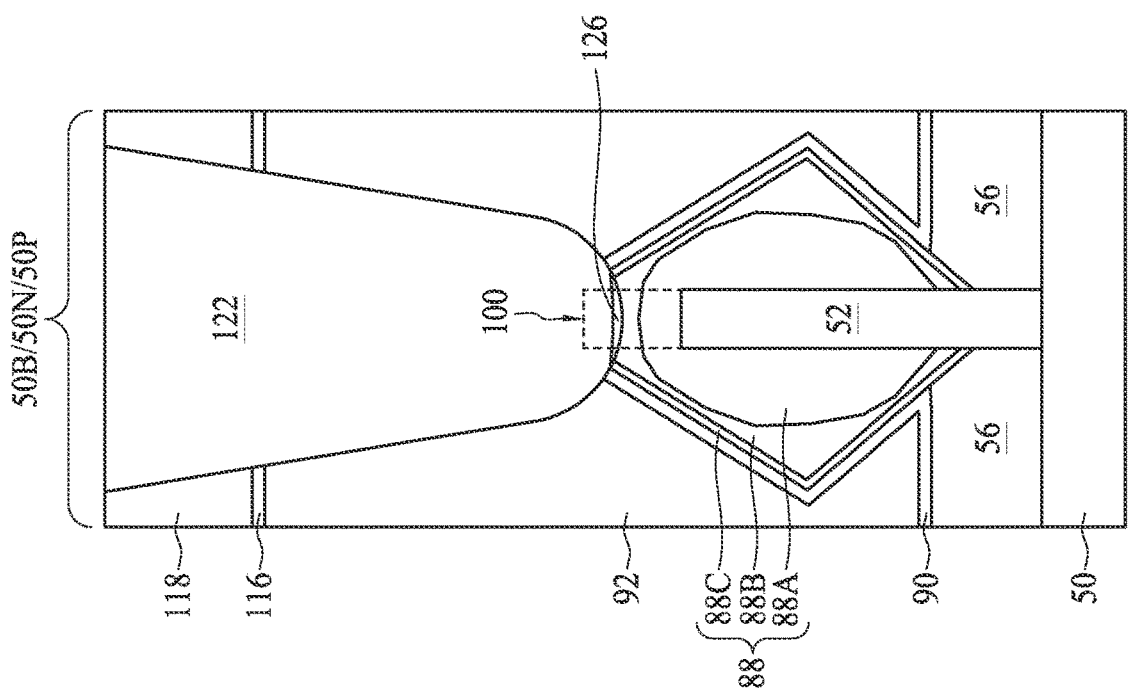
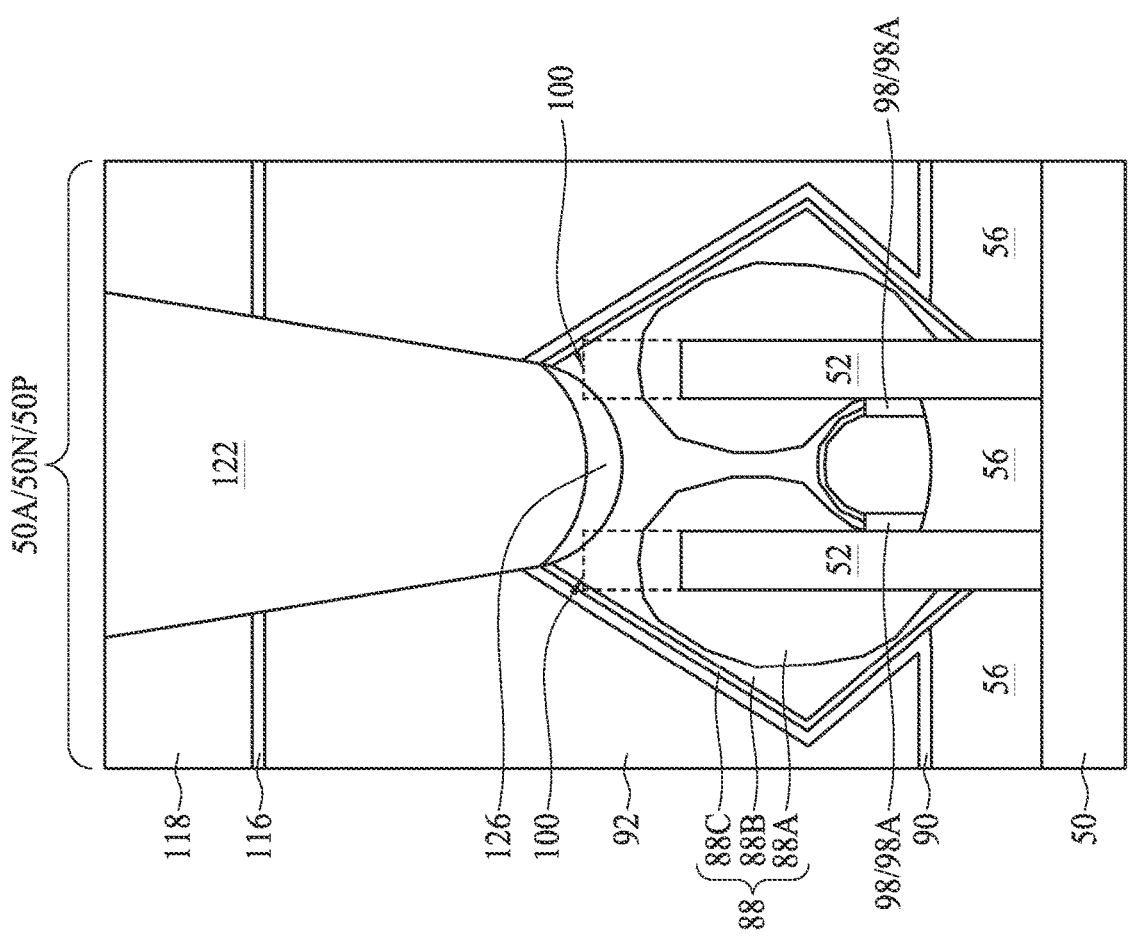
FIG. 19B
FIG. 19A

SEMICONDUCTOR DEVICE AND METHOD

PRIORITY CLAIM AND CROSS-REFERENCE

This application claims the benefit of U.S. Provisional Application No. 63/082,541, filed on Sep. 24, 2020, and U.S. Provisional Application No. 63/065,575, filed on Aug. 14, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 through 19B are views of intermediate stages in the manufacturing of FinFETs, in accordance with some embodiments.

DETAILED DESCRIPTION

Figure 1:
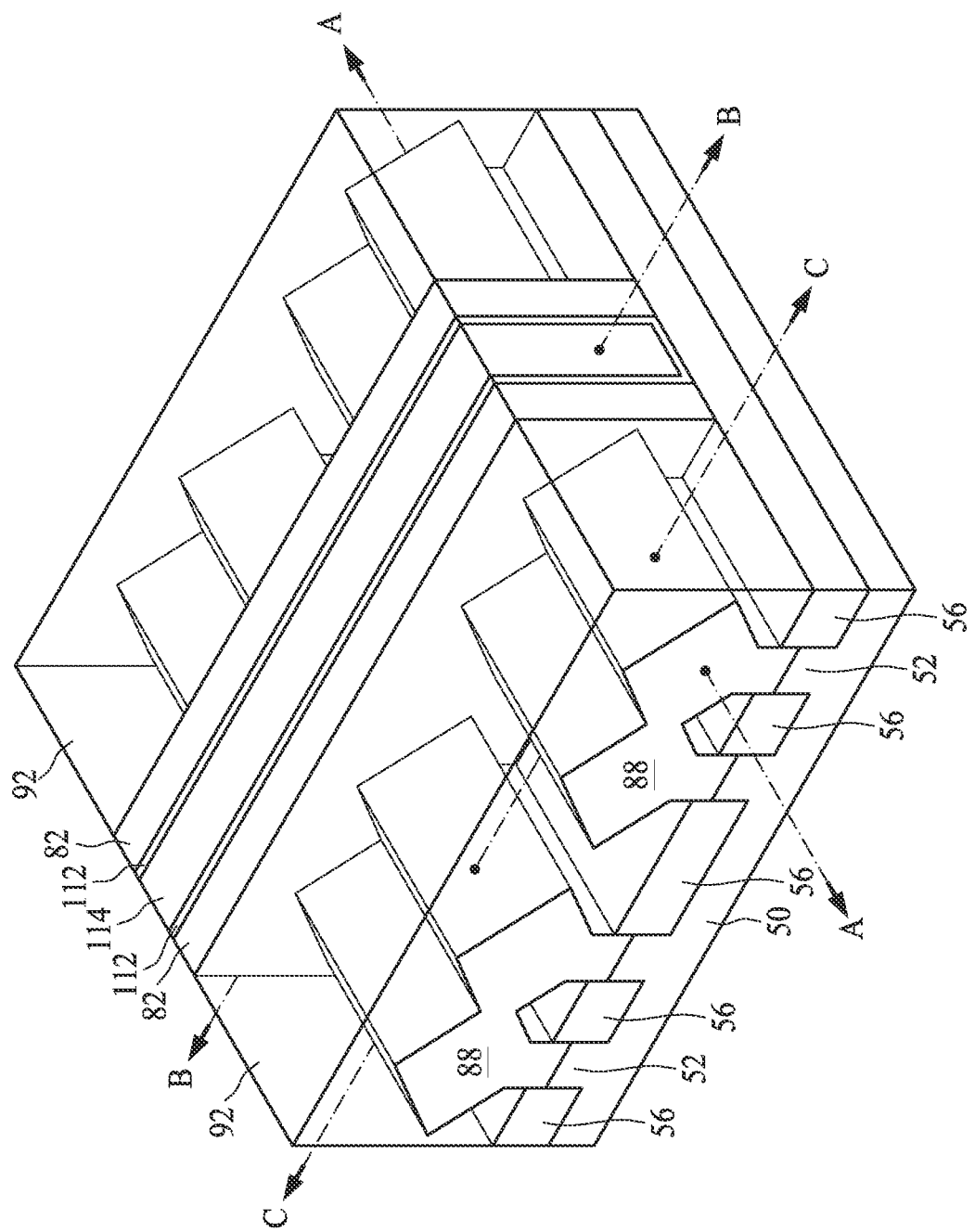
FIG. 1 illustrates an example of a FinFET in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, source/drain recesses are patterned in fins, and in isolation regions that are around the fins. Epitaxial source/drain regions are grown in the source/drain recesses, so that the epitaxial source/drain regions have main portions in the fins, and projecting portions that extend into (e.g., beneath the top surfaces of) the isolation regions. Forming additional source/drain recesses for the epitaxial source/drain regions to be grown in allows the volume of the epitaxial source/drain regions to be increased.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs include fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may include a single material or a plurality of materials. In this context, the fins 52 refer to the portions extending between the neighboring STI regions 56.

Gate dielectrics 112 are along sidewalls and over top surfaces of the fins 52, and gate electrodes 114 are over the gate dielectrics 112. Source/drain regions 88 are disposed in opposite sides of the fin 52 with respect to the gate dielectrics 112 and gate electrodes 114. Gate spacers 82 separate the source/drain regions 88 from the gate dielectrics 112 and the gate electrodes 114. An inter-layer dielectric (ILD) 92 is disposed over the source/drain regions 88 and the STI regions 56. In embodiments where multiple transistors are formed, the source/drain regions 88 may be shared between various transistors. In embodiments where one transistor is formed from multiple fins 52, neighboring source/drain regions 88 may be electrically connected, such as through merging the source/drain regions 88 by epitaxial growth, or through coupling the source/drain regions 88 with a same source/drain contact.

FIG. 1 further illustrates several reference cross-sections. Cross-section A-A is along a longitudinal axis of a fin 52 and in a direction of, for example, a current flow between the source/drain regions 88 of the FinFETs. Cross-section B-B is perpendicular to cross-section A-A and is along a longitudinal axis of a gate electrode 114 and in a direction, for example, perpendicular to the direction of current flow between the source/drain regions 88 of the FinFETs. Cross-section C-C is also perpendicular to cross-section A-A and extends through the source/drain regions 88 of the FinFETs. Subsequent figures refer to these reference cross-sections for clarity.

Figure 2:
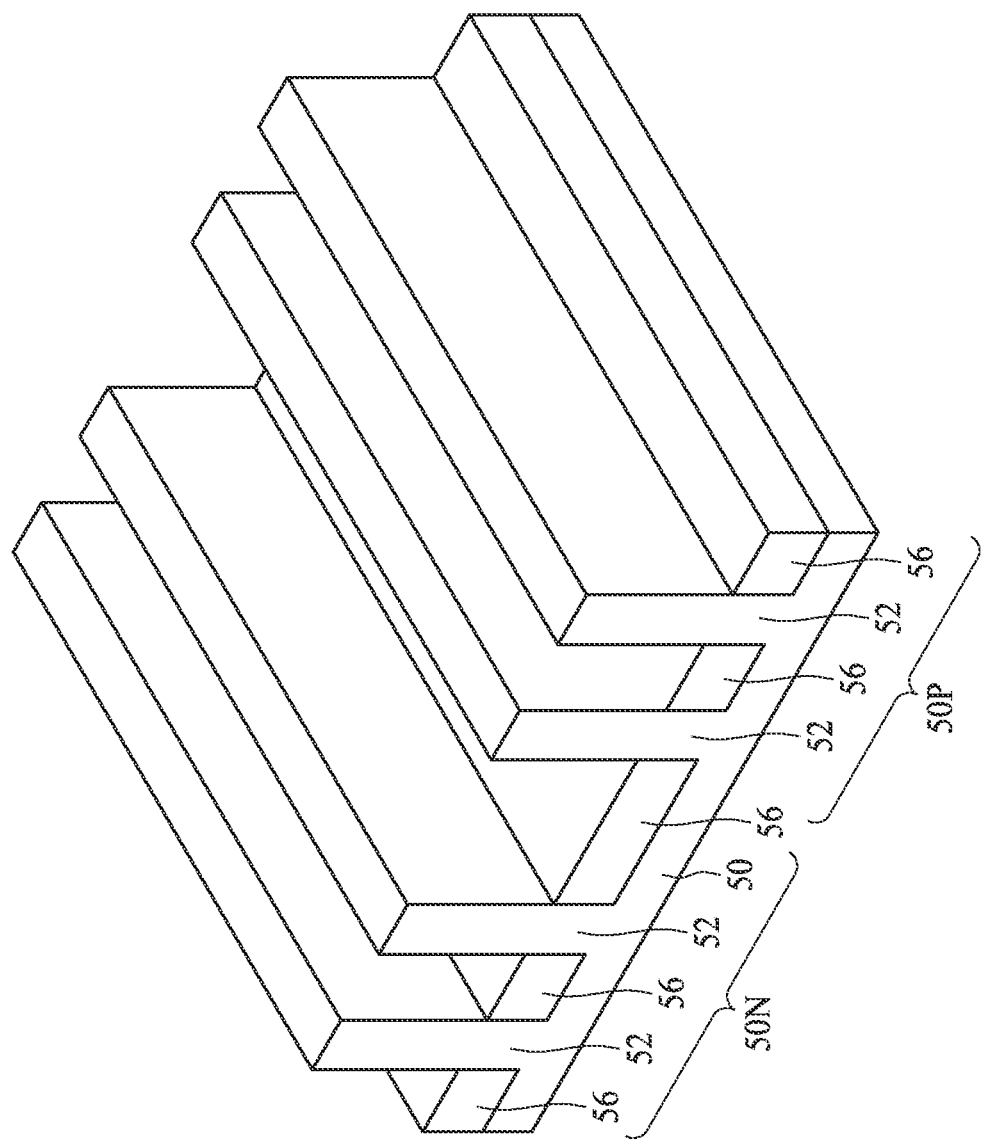
Figure 3:
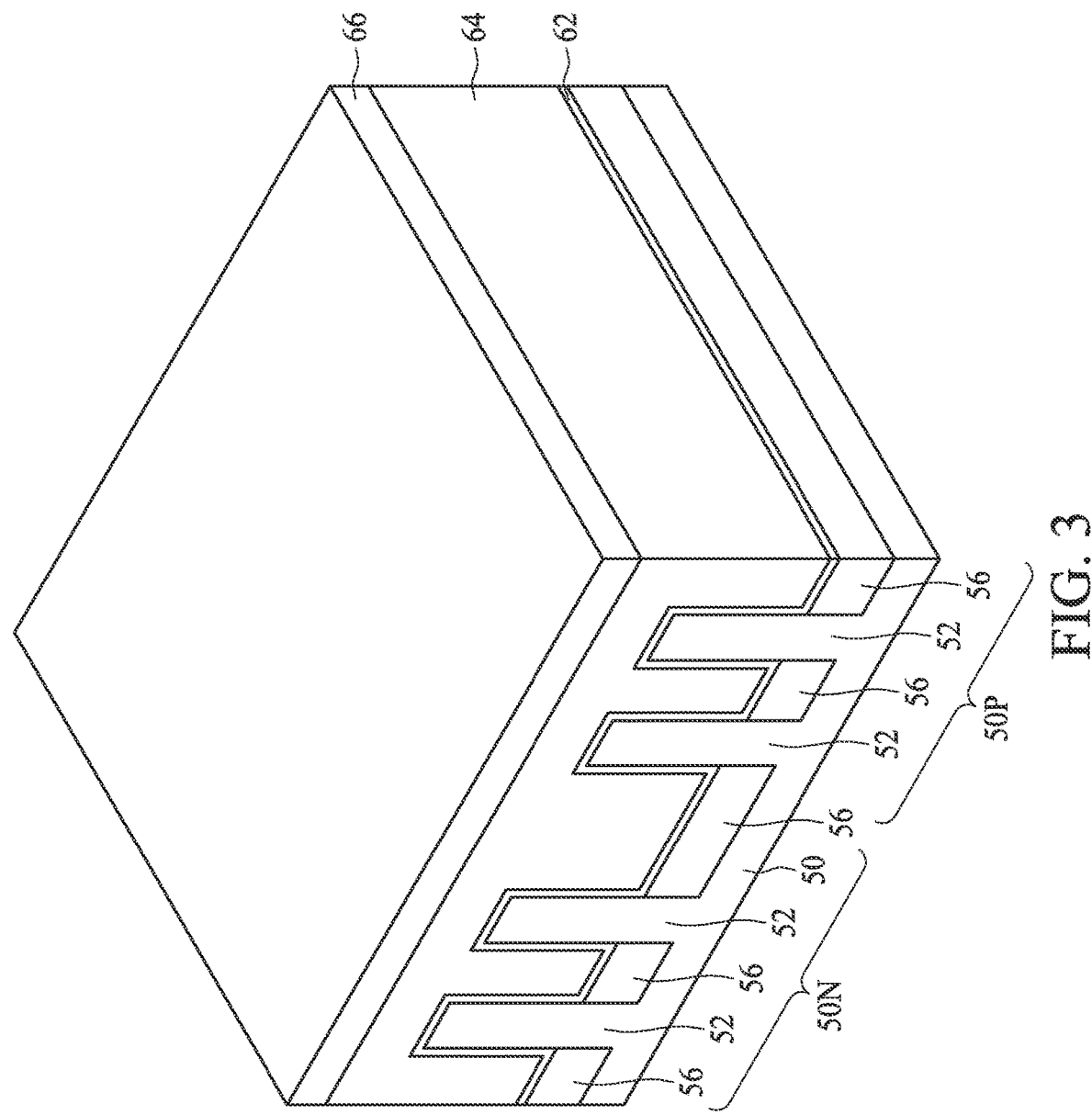
Figure 4:
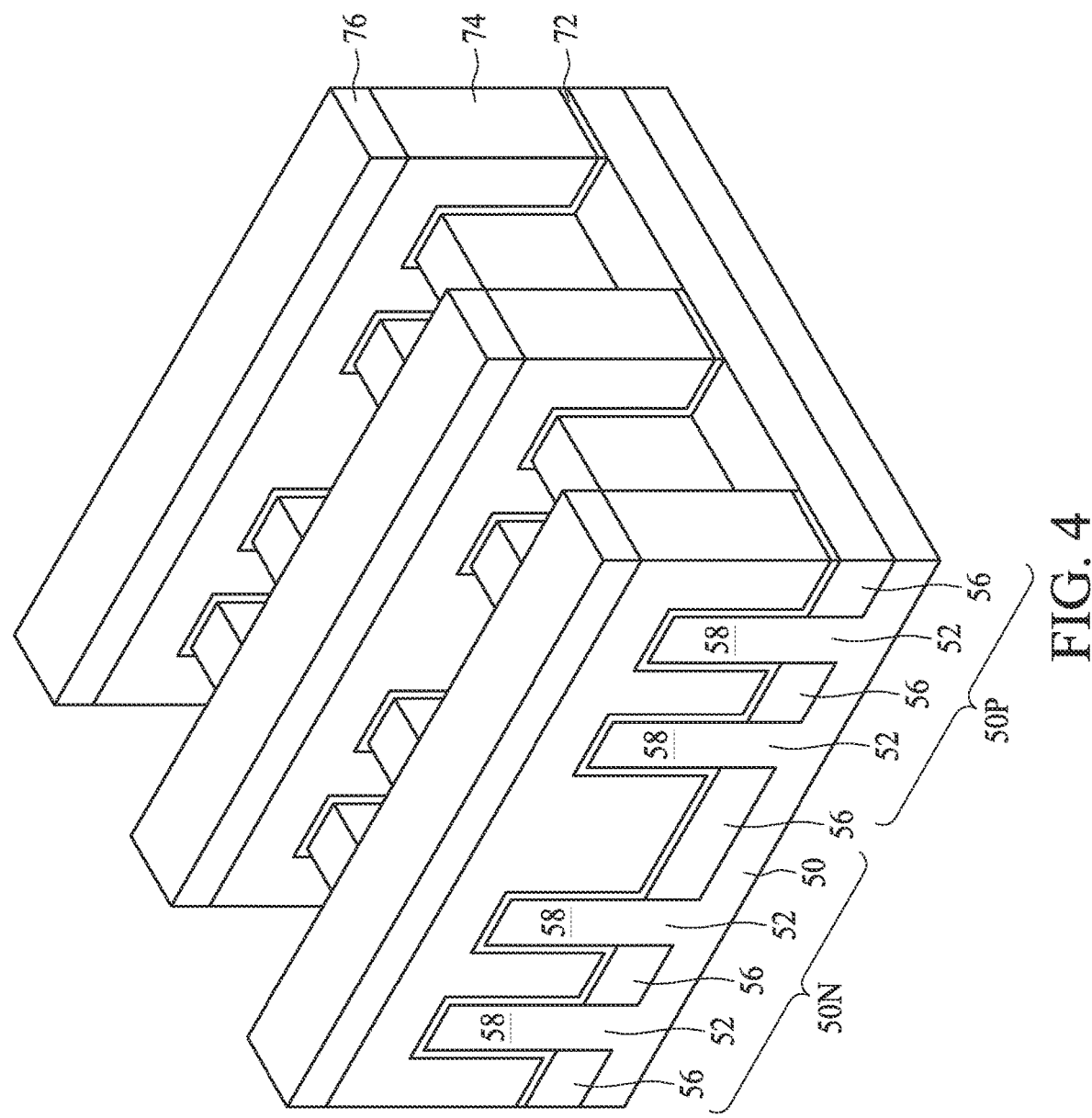

FIGS. 2 through 19B are views of intermediate stages in the manufacturing of FinFETs, in accordance with some embodiments. FIGS. 2, 3, and 4 are three-dimensional views. FIGS. 5A, 13A, 14A, 15A, 16A, and 17A are cross-sectional views illustrated along a similar cross-section as reference cross-section A-A in FIG. 1. FIGS. 5B, 13B, 14B, 15B, 16B, and 17B are cross-sectional views illustrated along a similar cross-section as reference cross-section B-B in FIG. 1. FIGS. 6A, 6B, 7A, 7B, 8A, 8B, 9A, 9B, 10A, 10B, 11A, 11B, 12A, 12B, 18A, 18B, 19A, and 19B are cross-sectional views illustrated along a similar cross-section as reference cross-section C-C in FIG. 1.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or a n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P, and any number of device features (e.g., other active devices, doped regions, isolation structures, etc.) may be disposed between the n-type region 50N and the p-type region 50P.

Fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 52. In some embodiments, the mask (or other layer) may remain on the fins 52.

STI regions 56 are formed over the substrate 50 and between neighboring fins 52. The STI regions 56 are disposed around lower portions of the fins 52 such that upper portions of the fins 52 protrude from between neighboring STI regions 56. In other words, the upper portions of the fins 52 extend above the top surfaces of the STI regions 56. The STI regions 56 separate the features of adjacent devices.

The STI regions 56 may be formed by any suitable method. For example, an insulation material can be formed over the substrate 50 and between neighboring fins 52. The insulation material may be an oxide, such as silicon oxide, a nitride, the like, or a combination thereof, and may be formed by a chemical vapor deposition (CVD) process, such as a high density plasma CVD (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the fins 52. Although the STI regions 56 are illustrated as a single layer, some embodiments may utilize multiple layers. For example, in some embodiments, a liner (not shown) may first be formed along a surface of the substrate 50 and the fins 52. Thereafter, a fill material, such as those discussed above may be formed over the liner. A removal process is then applied to the insulation material to remove excess insulation material over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material are coplanar (within process variations) after the planarization process is complete. In embodiments in which a mask remains on the fins 52, the planarization process may expose the mask or remove the mask such that top surfaces of the mask or the fins 52, respectively, and the insulation material are coplanar (within process variations) after the planarization process is complete. The insulation material is then recessed to form the STI regions 56. The insulation material is recessed such that upper portions of the fins 52 in the n-type region 50N and in the p-type region 50P protrude from between neighboring portions of the insulation material. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The insulation material may be recessed using an acceptable etching process, such as one that is selective to the material of the insulation material (e.g., etches the material of the insulation material at a faster rate than the material of the fins 52). For example, an oxide removal using, for example, dilute hydrofluoric (dHF) acid may be used.

The process described above is just one example of how the fins 52 and the STI regions 56 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer. In such embodiments, the fins 52 comprise the homoepitaxial structures, and the STI regions 56 comprise the remaining portions of the dielectric layer. Additionally, in some embodiments, heteroepitaxial structures can be used for the fins 52. For example, the fins 52 can be recessed, and a material different from the fins 52 may be epitaxially grown over the recessed material. In such embodiments, the fins 52 comprise the recessed material as well as the epitaxially grown material disposed over the recessed material, and the STI regions 56 comprise the remaining portions of the dielectric layer. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In such embodiments, the fins 52 comprise the heteroepitaxial structures, and the STI regions 56 comprise the remaining portions of the dielectric layer. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., a NMOS region) different from the material in p-type region 50P (e.g., a PMOS region). In various embodiments, upper portions of the fins 52 may be formed of silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells (not shown) may be formed in the fins 52 and/or the substrate 50. In some embodiments, a p-type well may be formed in the n-type region 50N, and a n-type well may be formed in the p-type region 50P. In some embodiments, p-type well or a n-type well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P. The photoresist can be formed by using a spin-on technique and can be patterned using acceptable photolithography techniques. Once the photoresist is patterned, a n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than about $10^{18}$ cm$^{-3}$, such as in the range of about $10^{16}$ cm$^{-3}$ to about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as in the range of about $10^{16}$ cm$^{-3}$ to about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In FIG. 3, a dummy dielectric layer 62 is formed on the fins 52. The dummy dielectric layer 62 may be, for example, silicon oxide, silicon nitride, a combination thereof, or the like, and may be deposited or thermally grown according to acceptable techniques. A dummy gate layer 64 is formed over the dummy dielectric layer 62, and a mask layer 66 is formed over the dummy gate layer 64. The dummy gate layer 64 may be deposited over the dummy dielectric layer 62 and then planarized, such as by a CMP. The mask layer 66 may be deposited over the dummy gate layer 64. The dummy gate layer 64 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 64 may be deposited by physical vapor deposition (PVD), CVD, sputter deposition, or other techniques for depositing the selected material. The dummy gate layer 64 may be made of other materials that have a high etching selectivity from the etching of isolation regions, e.g., the STI regions 56 and/or the dummy dielectric layer 62. The mask layer 66 may include one or more layers of, for example, silicon nitride, silicon oxynitride, or the like. In this example, a single dummy gate layer 64 and a single mask layer 66 are formed across the n-type region 50N and the p-type region 50P. In the illustrated embodiment, the dummy dielectric layer 62 covers the STI regions 56, extending over the STI regions 56 and between the dummy gate layer 64 and the STI regions 56. In another embodiment, the dummy dielectric layer 62 covers only the fins 52.

In FIG. 4, the mask layer 66 may be patterned using acceptable photolithography and etching techniques to form masks 76. The pattern of the masks 76 then may be transferred to the dummy gate layer 64 to form dummy gates 74. In some embodiments, the pattern of the masks 76 is also transferred to the dummy dielectric layer 62 by an acceptable etching technique to form dummy dielectrics 72. The dummy gates 74 cover respective channel regions 58 of the fins 52. The pattern of the masks 76 may be used to physically separate each of the dummy gates 74 from adjacent dummy gates 74. The dummy gates 74 may also have a lengthwise direction substantially perpendicular to the lengthwise direction of the fins 52. The masks 76 may be removed during the patterning of the dummy gate 74, or may be removed in subsequent processing.

FIGS. 5A through 19B illustrate various additional steps in the manufacturing of embodiment devices. FIGS. 5A through 19B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are described in the text accompanying each figure.

Figure 5B:
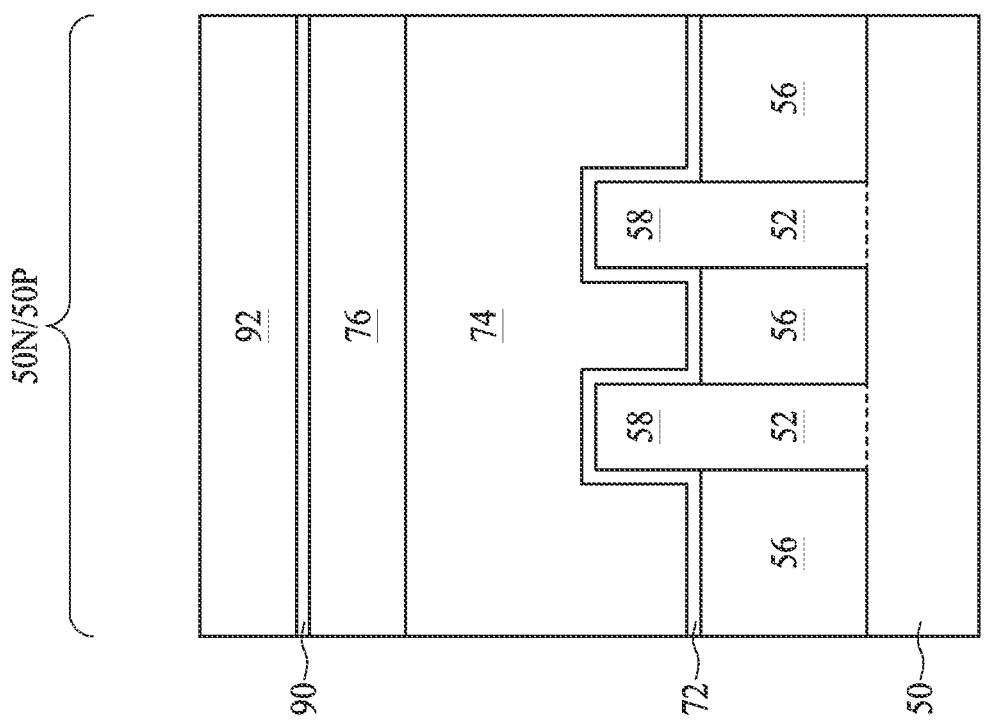
Figure 5A:
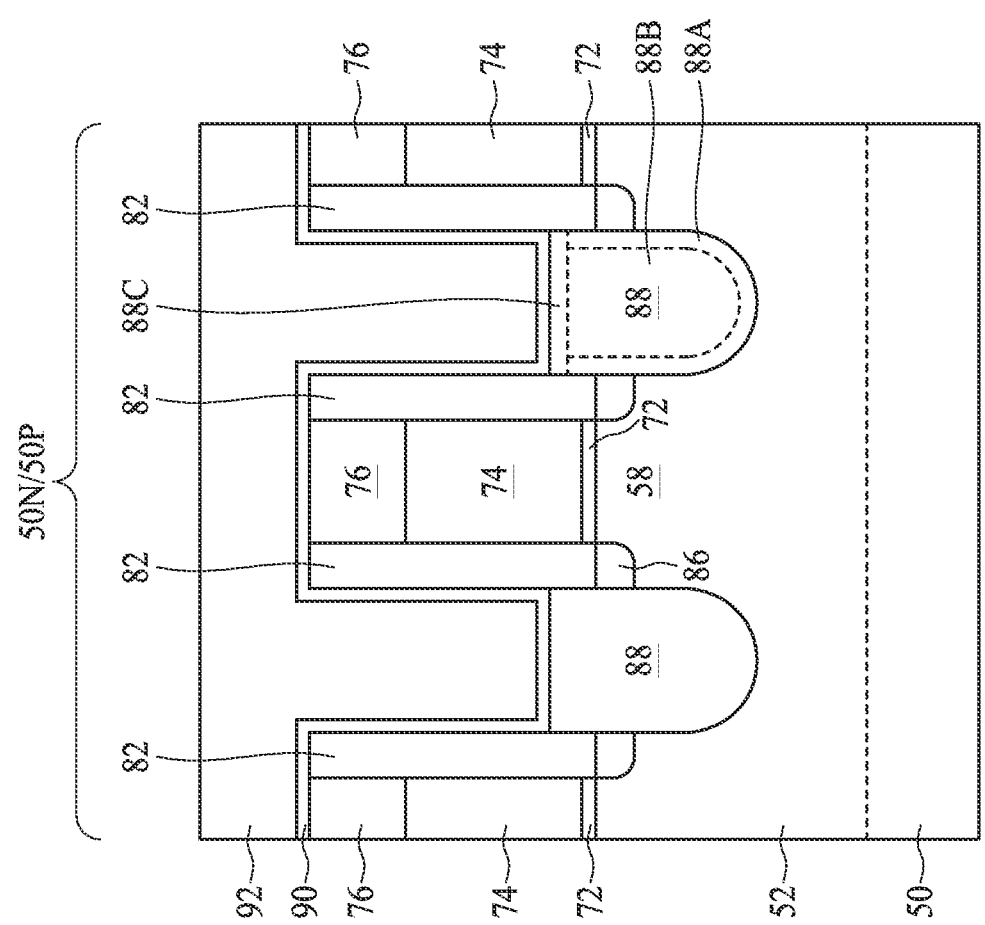

In FIGS. 5A and 5B, gate spacers 82, lightly doped source/drain (LDD) regions 86, epitaxial source/drain regions 88, a contact etch stop layer (CESL) 90, and a first ILD 92 are formed. The formation of these features will be subsequently described in greater detail for FIGS. 6A through 12B. The LDD regions 86 are formed in the fins 52. The gate spacers 82 are formed over the LDD regions 86, and on sidewalls of the dummy gates 74 and the masks 76 (if present). The epitaxial source/drain regions 88 are formed in the fins 52 such that each dummy gate 74 is disposed between respective neighboring pairs of the epitaxial source/drain regions 88. The epitaxial source/drain regions 88 include multiple layers, such as liner layers 88A, main layers 88B, and finishing layers 88C. In some embodiments, the gate spacers 82 are used to separate the epitaxial source/drain regions 88 from the dummy gates 74 by an appropriate lateral distance so that the epitaxial source/drain regions 88 do not short out subsequently formed gates of the resulting FinFETs. The CESL 90 may be deposited over the epitaxial source/drain regions 88, the gate spacers 82, the STI regions 56, and the masks 76 (if present) or the dummy gates 74. The first ILD 92 is deposited over the CESL 90.

FIGS. 6A through 12B illustrate various steps in the manufacturing of embodiment devices. Specifically, the formation of the LDD regions 86, the gate spacers 82, the epitaxial source/drain regions 88, the CESL 90, and the first ILD 92 is illustrated. FIGS. 6A, 7A, 8A, 9A, 10A, 11A, and 12A illustrate a first region 50A, in which one device is formed from multiple fins 52. FIGS. 6B, 7B, 8B, 9B, 10B, 11B, and 12B illustrate a second region 50B, in which one device is formed from a single fin 52. The first region 50A may be for forming a first type of devices (such as logic devices) and the second region 50B may be for forming a second type of devices (such as memory devices). The regions 50A and 50B may be processed simultaneously, and are discussed together. It should be appreciated that each of the regions 50A, 50B can include fins 52 from both of the regions 50N and 50P of the substrate 50. In other words, the first region 50A and the second region 50B can each include n-type devices and p-type devices.

In the first region 50A, the fins 52 may be formed in groups, with each group of fins 52 being used to form a device. The fins 52 of a group may be spaced apart from one another by a first spacing distance $S_1$, which can be in the range of about 10 nm to about 30 nm. The fins 52 of each group may be spaced apart from the fins 52 of other groups by a second spacing distance $S_2$, which can be in the range of about 20 nm to about 50 nm. The second spacing distance $S_2$ is greater than the first spacing distance $S_1$.

Figure 6B:
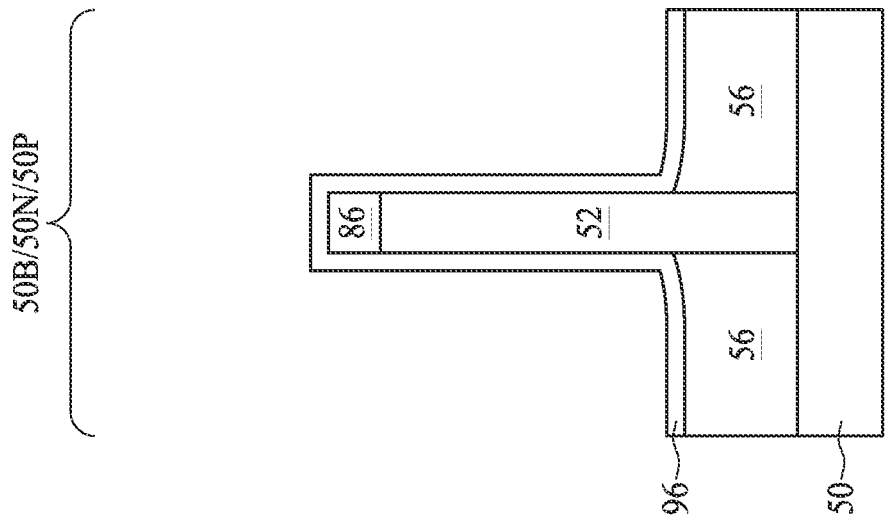
Figure 6A:
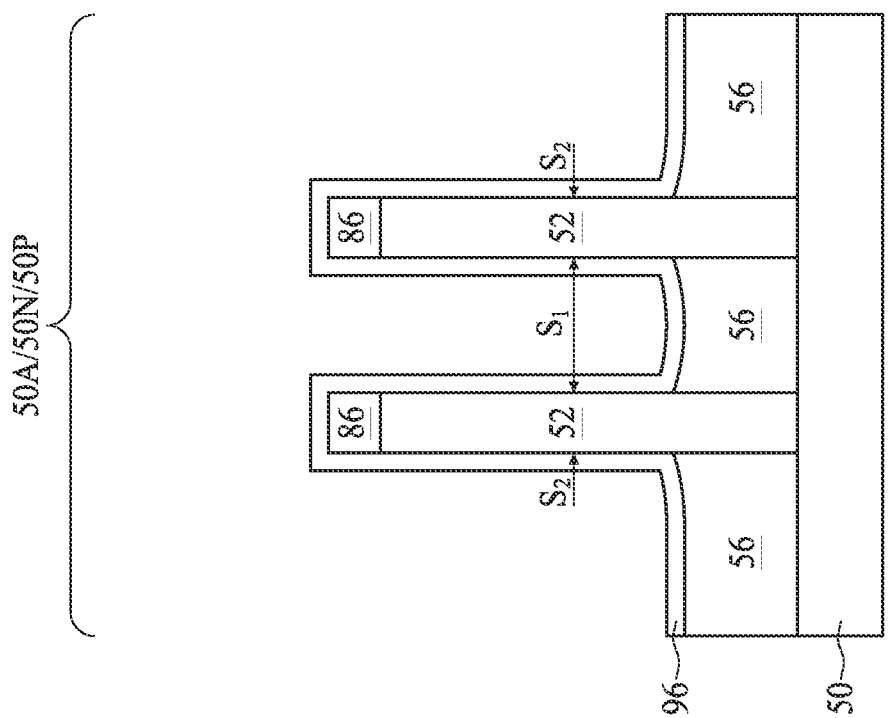

In FIGS. 6A and 6B, a spacer layer 96 is formed on exposed surfaces of the fins 52, the STI regions 56, and the masks 76 (if present) or the dummy gates 74 (see FIG. 5A). The spacer layer 96 may be formed of one or more dielectric materials. Acceptable dielectric materials include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like; multilayers thereof; or the like. The dielectric materials may be formed by a conformal deposition process such as chemical vapor deposition (CVD), plasma enhanced chemical vapor deposition (PECVD), atomic layer deposition (ALD), or the like. In some embodiments, the spacer layer 96 includes multiple layers of silicon oxycarbonitride (e.g., $SiO_xN_yC_{1-x-y}$, where x and y can be in the range of 0 to 1). Each layer may have a similar or different composition of silicon oxycarbonitride.

Before or after the formation of the spacer layer 96, implants may be performed to form the LDD regions 86. In the embodiments with different device types, similar to the implants for the wells previously discussed, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be any of the n-type impurities previously discussed, and the p-type impurities may be any of the p-type impurities previously discussed. The LDD regions 86 may have a concentration of impurities in the range of about $10^{15}$ cm$^{-3}$ to about $10^{19}$ cm$^{-3}$. An anneal may be used to repair implant damage and to activate the implanted impurities.

Figure 7B:
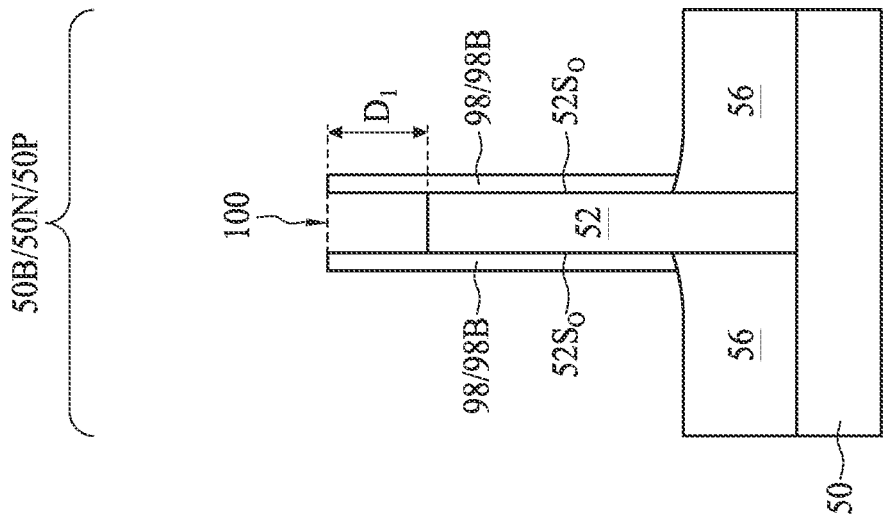
Figure 7A:
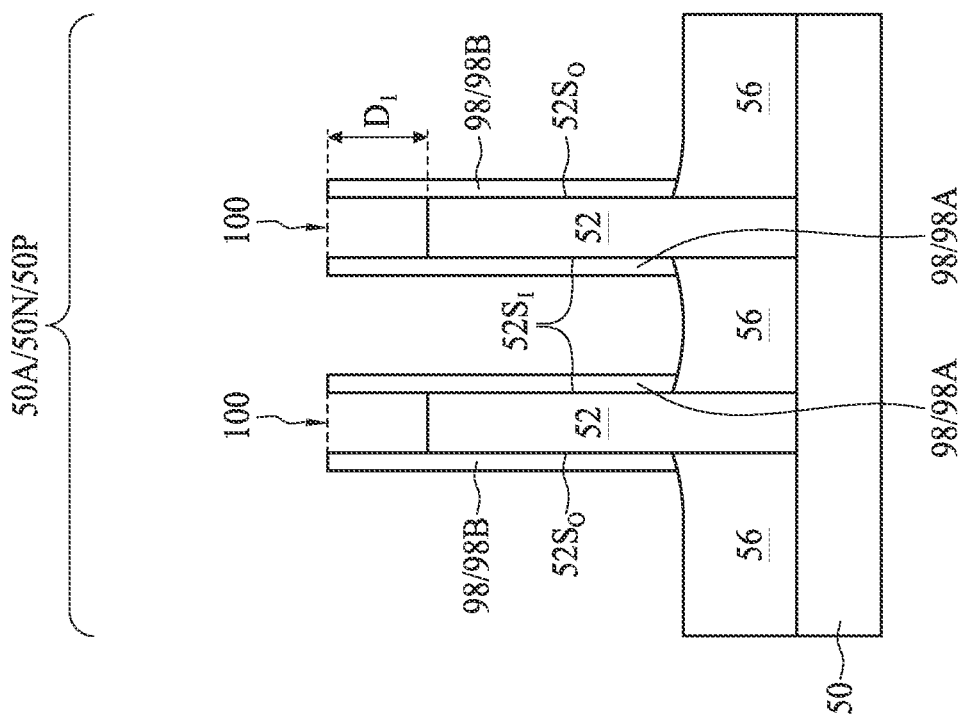

In FIGS. 7A and 7B, the spacer layer 96 is patterned to form fin spacers 98 and also form the gate spacers 82 (see FIG. 5A). The fin spacers 98 are formed on the sidewalls of the fins 52 and the top surfaces of the STI regions 56. The gate spacers 82 (see FIG. 5A) are formed on the sidewalls of the dummy gates 74 and the top surfaces of the fins 52. An acceptable etch process, such as a dry etch, a wet etch, the like, or a combination thereof, may be performed to pattern the spacer layer 96. The etching may be anisotropic. The gate spacers 82 are formed by the same process for forming the fin spacers 98. For example, the spacer layer 96, when etched, has first portions left on the sidewalls of the fins 52 (hence forming the fin spacers 98) and has second portions left on the sidewalls of the dummy gates 74 (hence forming the gate spacers 82). After etching, the gate spacers 82 and the fin spacers 98 can each have straight sidewalls (as illustrated) or can have curved sidewalls (not illustrated).

In some embodiments, dielectric layers (subsequently described in greater detail for FIGS. 20A and 20B) are formed after the fin spacers 98 are formed. The dielectric layers are disposed over the STI regions 56 and between the fin spacers 98. The dielectric layers provide additional separation of the features of adjacent devices.

The fin spacers 98 include inner fin spacers 98A and outer fin spacers 98B. The inner fin spacers 98A are disposed between the fins 52 of a same device (e.g., between the fins 52 in the first region 50A). Specifically, the inner fin spacers 98A are disposed on sidewalls of the fins 52 of a same device that face towards one another, which may be referred to as inner sidewalls $52S_I$ of the fins 52. The outer fin spacers 98B are not disposed between the fins 52 of a same device. Specifically, the outer fin spacers 98B are disposed on sidewalls of the fins 52 of a same device that face away from one another, which may be referred to as outer sidewalls $52S_O$ of the fins 52. As such, the outer fin spacers 98B are formed in both the first region 50A and the second region 50B, while the inner fin spacers 98A are formed in the first region 50A but not the second region 50B. Further, because the fins 52 of a same group are spaced apart from one another by a lesser spacing distance than the groups of fins 52, the adjacent inner fin spacers 98A are spaced apart by a lesser spacing distance than the adjacent outer fin spacers 98B.

Source/drain recesses 100 are then patterned in the fins 52. In the illustrated embodiment, the source/drain recesses 100 extend into the fins 52, and through the LDD regions 86 (see FIG. 5A). The source/drain recesses 100 may be patterned by any acceptable etch process. The source/drain recesses 100 may also extend into the substrate 50. In the illustrated embodiment, the source/drain recesses 100 are etched such that bottom surfaces of the source/drain recesses 100 are disposed above the top surfaces of the STI regions 56. The source/drain recesses 100 may also be etched such that bottom surfaces of the source/drain recesses 100 are disposed below the top surfaces of the STI regions 56. After the source/drain recesses 100 are patterned, the bottom surfaces of the source/drain recesses 100 are disposed below the top surfaces of the fin spacers 98. The source/drain recesses 100 may be formed by etching the fins 52 using an anisotropic etching processes, such as a RIE, a NBE, or the like. Referring back to FIG. 5A, the gate spacers 82, and the masks 76 (if present) or the dummy gates 74 are collectively used as an etching mask to cover portions of the fins 52 during the etching processes used to form the source/drain recesses 100.

As will be subsequently described in greater detail, source/drain regions will be epitaxially grown in the source/drain recesses 100. The depth $D_1$ of the source/drain recesses 100 determines the volume of the source/drain regions. In some embodiments, the depth $D_1$ of the source/drain recesses 100 is in the range of about 10 nm to about 50 nm, such as in the range of about 10 nm to about 30 nm. A timed etching process may be used to stop the etching of the source/drain recesses 100 after the source/drain recesses 100 reach a desired depth $D_1$. As will be subsequently described in greater detail, forming the source/drain recesses 100 to such a depth $D_1$ allows source/drain regions of a sufficient volume to be formed while reducing the risk of merging the adjacent epitaxial source/drain regions 88 of different devices.

Figure 8B:
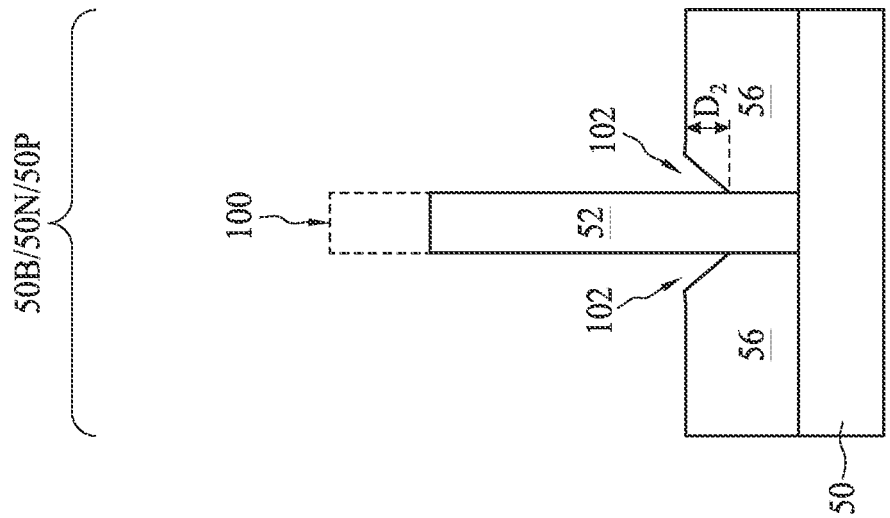
Figure 8A:
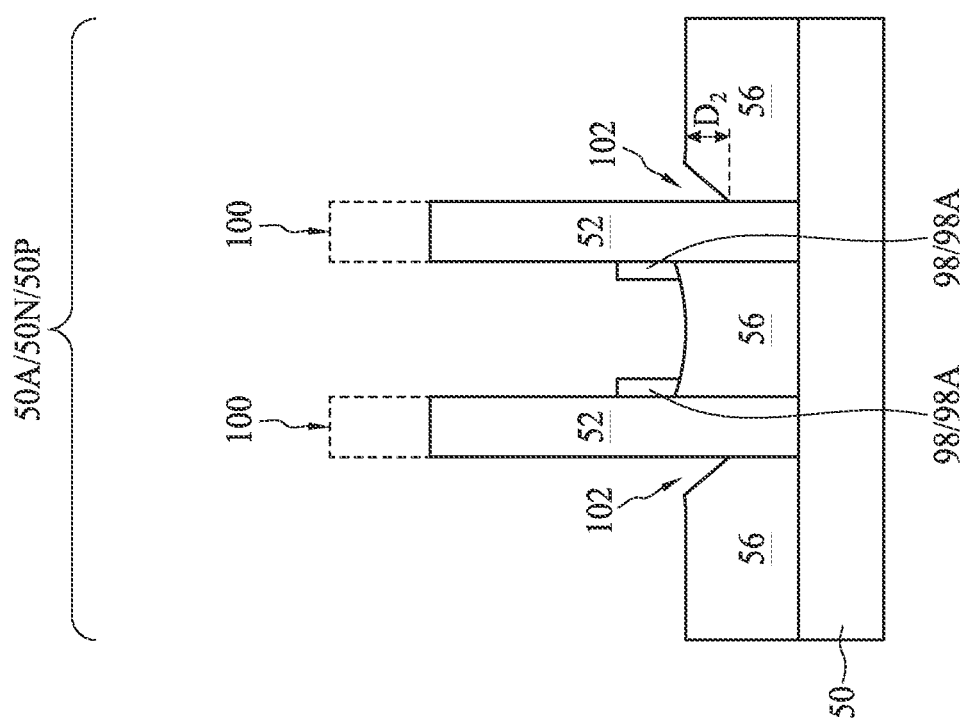

In FIGS. 8A and 8B, the inner fin spacers 98A are recessed and the outer fin spacers 98B are removed. After the inner fin spacers 98A are recessed, the bottom surfaces of the source/drain recesses 100 are disposed above the top surfaces of the fin spacers 98. Recessing the inner fin spacers 98A and removing the outer fin spacers 98B exposes the sidewalls of the fins 52 that are below the source/drain recesses 100. As will be subsequently described in greater detail, source/drain regions will be epitaxially grown to extend along the sidewalls of the fins 52 that are below the source/drain recesses 100. The sidewalls of the fins 52 are <110> surfaces, and growing the source/drain regions from such surfaces helps grow the source/drain regions to a greater volume. The inner fin spacers 98A are not removed, and remain so that they may be used in subsequent processing to control epitaxial growth. Further, source/drain recesses 102 are patterned in the portions of the STI regions 56 that were disposed beneath the outer fin spacers 98B. The source/drain recesses 102 expose additional portions of the sidewalls of the fins 52, thereby providing additional surfaces for epitaxial growth of the source/drain regions. The source/drain recesses 102 also provide additional room in which the source/drain regions may be grown, thereby allowing the source/drain regions to be formed to a greater volume. The depth $D_2$ of the source/drain recesses 102 determines the volume of the source/drain regions. In some embodiments, the depth $D_2$ of the source/drain recesses 102 is in the range of about 0 nm to about 10 nm. As will be subsequently described in greater detail, forming the source/drain recesses 102 to such a depth $D_2$ allows source/drain regions of a sufficient volume to be formed without inducing short-channel effects in the devices.

In some embodiments, the inner fin spacers 98A are recessed, the outer fin spacers 98B are removed, and the source/drain recesses 102 are patterned by etching. The etching may be any acceptable etch process, such as a reactive ion etch (RIE), neutral beam etch (NBE), the like, or a combination thereof. The etch may be anisotropic. The etch is selective to the material of the fin spacers 98 and the STI regions 56 (e.g., etches the materials of the fin spacers 98 and the STI regions 56 at a faster rate than the material of the fins 52). The fin spacers 98 and the gate spacers 82 (see FIG. 5A) are formed of the same material, and so the etch process may be performed with a mask (e.g., a photoresist) that covers the gate spacers 82, so that the gate spacers 82 remain substantially unremoved. In some embodiments, a single etch process is performed to accomplish the recessing of the inner fin spacers 98A, the removal of the outer fin spacers 98B, and the patterning of the source/drain recesses 102. The etch process can selectively etch the outer fin spacers 98B and the STI regions 56 at a faster rate than the inner fin spacers 98A. In some embodiments, the etch process is an anisotropic etch performed by a plasma process. The plasma etching process is different from the etching process used to form the source/drain recesses 100.

The plasma etching process is performed in a processing chamber with process gas(es) being supplied into the processing chamber. In some embodiments, plasma generation power is pulsed between a low power (e.g., substantially zero watts) and a high power (which will be subsequently described in greater detail) during the plasma etching process. In some embodiments, an applied bias voltage is also pulsed between a low voltage (e.g., substantially zero volts) and a high voltage (which will be subsequently described in greater detail) during the plasma etching process. The plasma generation power and/or the bias voltage may be pulsed as a rectangular wave or a square wave, although other pulse shapes may be used. In some embodiments, the plasma generation power and the bias voltage have synchronized pulses, such that the plasma generation power and the bias voltage are simultaneously in their respective low state or high state. In some embodiments, the plasma is a direct plasma. In some embodiments, the plasma is a remote plasma that is generated in a separate plasma generation chamber connected to the processing chamber. Process gas(es) can be activated into plasma by any suitable method of generating the plasma, such as transformer coupled plasma (TCP) systems, inductively coupled plasma (ICP) systems, capacitively coupled plasma (CCP) systems, magnetically enhanced reactive ion techniques, electron cyclotron resonance techniques, or the like.

The process gas(es) used in the plasma etching process include one or more etchant gases. In embodiments where the fin spacers 98 are formed of silicon oxycarbonitride and the STI regions 56 are formed of silicon oxide, suitable examples of the etchant gases include $CF_4$, $CF_2Cl_2$, the like, or combinations thereof. Additional process gas(es) such as oxygen gas and/or hydrogen gas may also be used. Carrier gas(es), such as $N_2$, Ar, He, or the like, may be used to carry the process gas(es) into the processing chamber. The process gas(es) may be flowed into the processing chamber at a rate in the range of about 10 sccm to about 500 sccm.

The plasma etching process may be performed using a bias voltage having a high voltage in the range of about 300 volts to about 500 volts. As will be subsequently described in greater detail, the bias voltage is large, which allows the etching of the fin spacers 98 to be better controlled. The plasma etching process may be performed using a plasma generation power having a high power in the range of about 50 watts to about 200 watts. In some embodiments, the plasma generation power and/or the bias voltage may be pulsed with a duty cycle in the range of about 10% to about 90%, and may have a pulse frequency in the range of about 10 kHz to about 50 kHz. The plasma etching process may be performed at a temperature in the range of about 25° C. to about 200° C. A pressure in the processing chamber may be in the range of about 5 mTorr to about 50 mTorr. The plasma etching process can be performed for a duration in the range of about 10 seconds to about 300 seconds.

As noted above, the plasma etching process is performed with a large bias voltage. The large bias voltage causes features in more crowded areas to be etched at a slower rate than features in less crowded areas. As such, because the adjacent inner fin spacers 98A are spaced apart by a lesser spacing distance than the adjacent outer fin spacers 98B, performing the plasma etching process with a large bias voltage allows the plasma etching process to etch the outer fin spacers 98B at a faster rate than the inner fin spacers 98A, even when the inner fin spacers 98A and the outer fin spacers 98B are formed of the same material. Further, as noted above, the plasma etching process is selective to the material of the fin spacers 98 and the STI regions 56. Thus, the plasma etching process can be performed until the fin spacers 98 are recessed/removed and the source/drain recesses 102 are formed, while avoiding over-etching (e.g., removal) of the fins 52. A timed etching process may be used to stop the etching of the source/drain recesses 102 after the source/drain recesses 102 reach a desired depth $D_2$. Performing the plasma etching process with etching parameters (e.g., bias voltage, duration, etc) in the ranges discussed herein allows for the removal of the outer fin spacers 98B and the patterning of the source/drain recesses 102 to the desired depth $D_2$ without over-etching of the inner fin spacers 98A or the fins 52. Performing the plasma etching process with etching parameters (e.g., bias voltage, duration, etc) outside of the ranges discussed herein may not allow for the removal of the outer fin spacers 98B or the patterning of the source/drain recesses 102 to the desired depth $D_2$ without over-etching of the inner fin spacers 98A and the fins 52.

In FIGS. 9A and 9B, liner layers 88A of the epitaxial source/drain regions 88 (see FIG. 5A) are grown on the fins 52. As will be subsequently described in greater detail, the liner layers 88A may fill portions of the source/drain recesses 102. In the illustrated embodiment, the liner layers 88A are not grown on all exposed surfaces of the fins 52. For example, portions of the sidewalls of the fins 52 in the source/drain recesses 102 may be free of the liner layers 88A. In another embodiment, the liner layers 88A grow on all exposed surfaces of the fins 52. Growing the liner layers 88A includes exposing the fins 52 to several precursors. The precursors include one or more semiconductor material precursor(s), a dopant precursor, and an etching precursor. The growth may be in an ambient such as hydrogen ($H_2$) or the like. In some embodiments, the fins 52 are simultaneously exposed to the semiconductor material precursor(s), the dopant precursor, and the etching precursor. In some embodiments, alternating growth and etch cycles are performed in which the fins 52 are exposed to the semiconductor material precursor(s) and the dopant precursor during growth cycles, and the fins 52 are exposed to the etching precursor during etch cycles.

The semiconductor material precursor(s) are any precursors for a desired semiconductor material. In embodiments where the epitaxial source/drain regions 88 are for n-type FinFETs, the precursors may be for a semiconductor material that can exert a tensile strain in the channel regions 58, such as silicon. For example, when the epitaxial source/drain regions 88 are formed of silicon, the semiconductor material precursor(s) may include a silicon-containing gas such as silane ($SiH_4$), disilane ($Si_2H_6$) dichlorosilane ($H_2SiCl_2$), or the like. In embodiments where the epitaxial source/drain regions 88 are for p-type FinFETs, the precursors may be for a semiconductor material that can exert a compressive strain in the channel regions 58, such as silicon-germanium. For example, when the epitaxial source/drain regions 88 are formed of silicon-germanium, the semiconductor material precursor(s) may include a germanium-containing gas such as germane ($GeH_4$), digermane ($Ge_2H_6$), or the like.

The dopant precursor is any precursor of an impurity having a desired conductivity type that complements the semiconductor material precursor(s). For example, in an embodiment where the epitaxial source/drain regions 88 are phosphorous-doped silicon (SiP) or arsenic-doped silicon (SiAs), such as when n-type devices are formed, the dopant precursor can be a phosphorous precursor such as phosphine ($PH_3$) or an arsenic precursor such as arsenic trichloride ($AsCl_3$), respectively. Likewise, in an embodiment where the epitaxial source/drain regions 88 are boron-doped silicon-germanium (SiGeB), such as when p-type devices are formed, the dopant precursor can be a boron precursor such as diborane ($B_2H_6$).

The etching precursor controls epitaxial growth of the liner layers 88A. In particular, the etching precursor increases the growth selectivity such that the liner layers 88A grow in desired locations (e.g., on the fins 52), and do not grow in undesired locations (e.g., on the STI regions 56). In some embodiments, the etching precursor is hydrochloric acid (HCl). Performing etching during growth helps the liner layers 88A grow conformally around the non-recessed portions of the fins 52. In some embodiments, the liner layers 88A largely grow outwards from the sidewalls of the fins 52, while growing upwards in the source/drain recesses 100 by a smaller amount. For example, the portions of the liner layers 88A in the source/drain recesses 100 can have a first thickness $T_1$ in the range of about 8 nm to about 10 nm, and the portions of the liner layers 88A on the sidewalls of the fins 52 can have a second thickness $T_2$ in the range of about 8 nm to about 12 nm, with the second thickness $T_2$ being greater than the first thickness $T_1$.

The liner layers 88A are formed with a low dopant concentration. When the epitaxial source/drain regions 88 are formed of an alloy semiconductor (e.g., silicon-germanium), the liner layers 88A are also formed with a low concentration of the alloying agent (e.g., germanium). In an embodiment where the epitaxial source/drain regions 88 are boron-doped silicon-germanium (SiGeB), the liner layers 88A can have a germanium concentration in the range of about 10% to about 40%, and can have a boron concentration in the range of about $5\times10^{19}$ cm$^{-3}$ to about $5\times10^{20}$ cm$^{-3}$. Forming the liner layers 88A with a low dopant concentration may help them adhere better to the fins 52 and may help avoid short-channel effects in the devices.

The inner fin spacers 98A block the epitaxial growth of the liner layers 88A along the portions of the STI regions 56 between the fins 52 of a same device (e.g., between the fins 52 in the first region 50A). Further, the inner fin spacers 98A cover portions of the inner sidewalls of the fins 52, thereby providing less surfaces for epitaxial growth between the fins 52 of a same device. As a result, merging of the liner layers 88A may be avoided, so that the liner layers 88A of a same device remain separated after growth. For example, the liner layers 88A of a same device (e.g., in the first region 50A) can remain separated by a distance $D_3$, which can be in the range of about 1 nm to about 5 nm. Because the inner fin spacers 98A are formed in the first region 50A but not the second region 50B, growth of the liner layers 88A may occur asymmetrically around the fins 52 in the first region 50A, and may occur symmetrically around the fins 52 in the second region 50B.

Figure 10B:
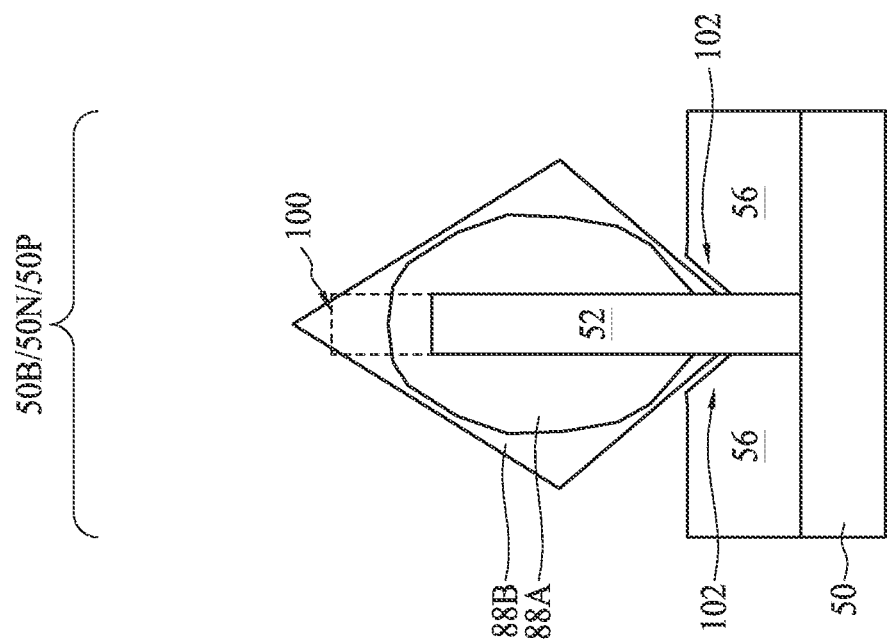
Figure 10A:
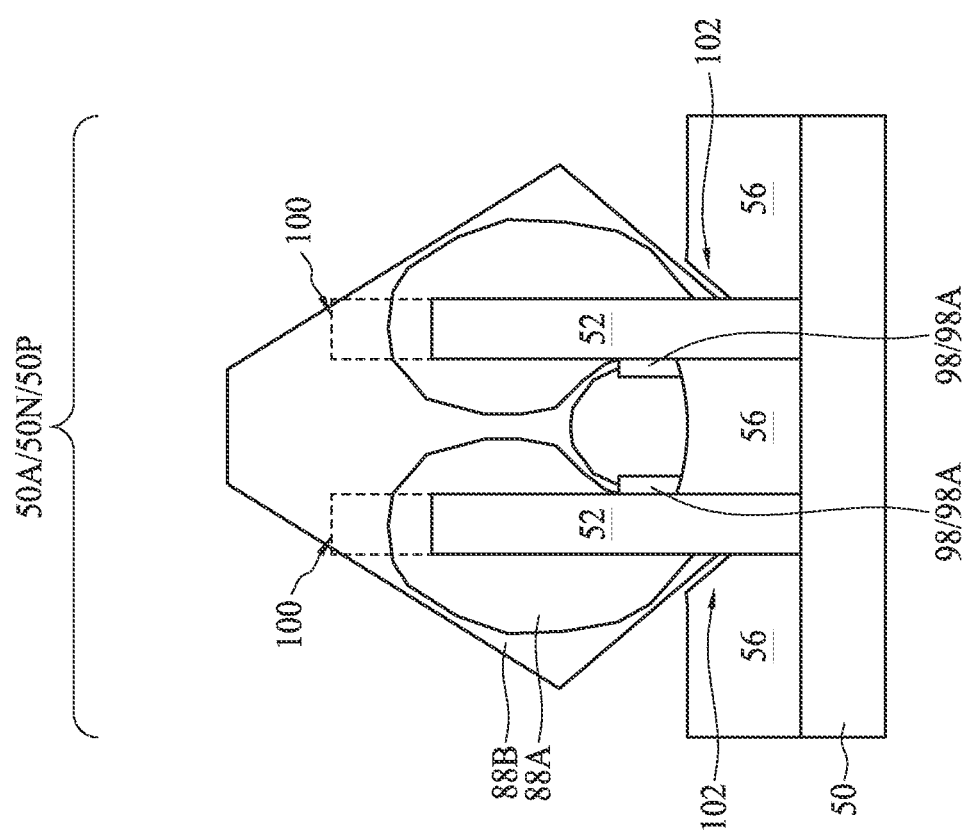

In FIGS. 10A and 10B, main layers 88B of the epitaxial source/drain regions 88 (see FIG. 5A) are grown on the liner layers 88A. As will be subsequently described in greater detail, the main layers 88B may fill portions of the source/drain recesses 102. Growing the main layers 88B includes exposing the liner layers 88A to several precursors. The precursors used for growing the main layers 88B may be selected from the same candidate precursors as those used for growing the liner layers 88A. The precursors used to grow the liner layers 88A and the main layers 88B may be the same precursors, or may include different precursors. The growth may be in an ambient such as hydrogen ($H_2$) or the like.

The main layers 88B are formed with a greater dopant concentration than the liner layers 88A. When the epitaxial source/drain regions 88 are formed of an alloy semiconductor (e.g., silicon-germanium), the main layers 88B are also formed with a greater concentration of the alloying agent (e.g., germanium) than the liner layers 88A. In an embodiment where the epitaxial source/drain regions 88 are boron-doped silicon-germanium (SiGeB), the main layers 88B can have a germanium concentration in the range of about 35% to about 65%, and can have a boron concentration in the range of about $5\times10^{20}$ $cm^{-3}$ to about $3\times10^{21}$ $cm^{-3}$. Forming the main layers 88B with a high dopant concentration may allow the epitaxial source/drain regions 88 to have reduced contact resistance and generate more strain (e.g., compressive or tensile strain) in the channel regions 58.

As noted above, etching is performed during the epitaxial growth. Performing etching during growth causes the growth to be directional so that <111> surfaces are formed for the main layers 88B. As a result, upper surfaces of the main layers 88B have facets which expand laterally outward beyond sidewalls of the fins 52. These facets cause adjacent epitaxial source/drain regions 88 of a same device to merge, such as in the first region 50A (as illustrated by FIG. 10A). Conversely, for devices that have a single fin 52, adjacent epitaxial source/drain regions 88 remain separated after the epitaxy process is completed, such as in the second region 50B (as illustrated by FIG. 10B). Less etching may be performed during growth of the main layers 88B than during growth of the liner layers 88A. For example, the etching precursor may be dispensed at a lesser flow rate during growth of the main layers 88B than during growth of the liner layers 88A. As a result, the main layers 88B grow upwards in the source/drain recesses 100 more than they grow outwards. The main layers 88B may fill a majority or even all of the source/drain recesses 100. Growing the main layers 88B in an upwards direction can help reduce the risk of undesirable merging the adjacent epitaxial source/drain regions 88 of different devices.

Figure 11B:
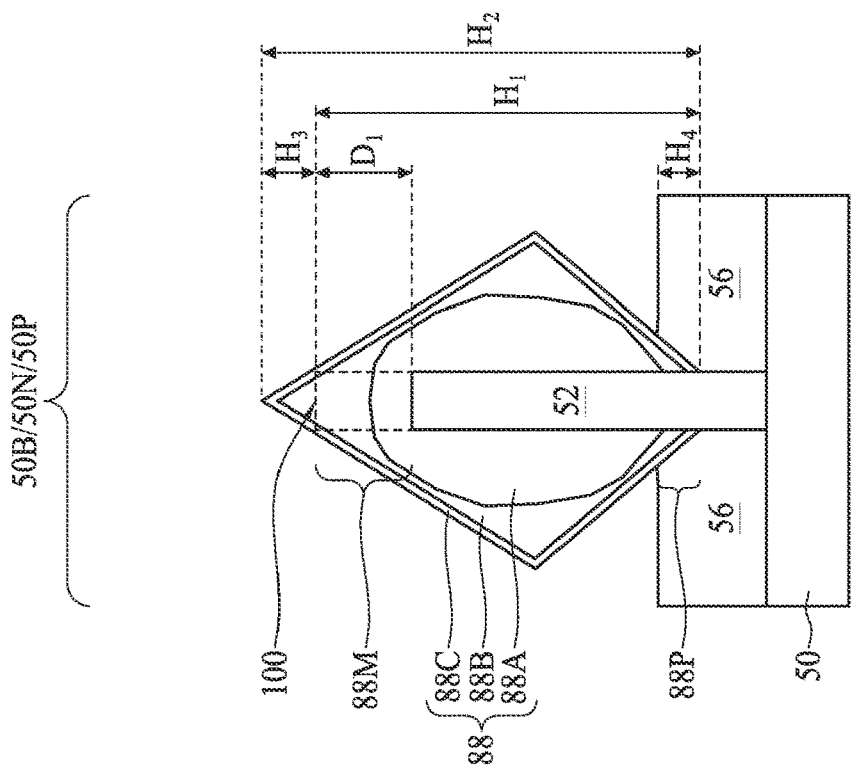
Figure 11A:
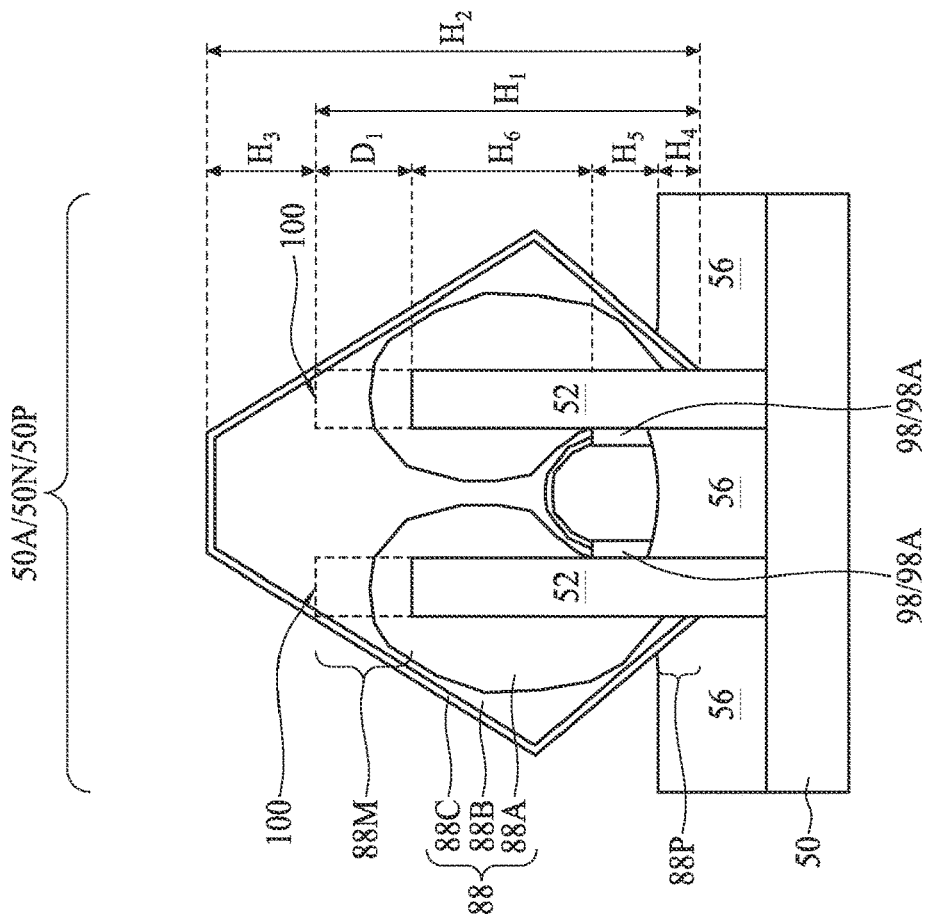

In FIGS. 11A and 11B, finishing layers 88C of the epitaxial source/drain regions 88 (see FIG. 5A) are grown on the main layers 88B. The finishing layers 88C fill the remainder of (and may overfill) the source/drain recesses 100 and the source/drain recesses 102. Growing the finishing layers 88C includes exposing the main layers 88B to several precursors. The precursors used for growing the finishing layers 88C may be selected from the same candidate precursors as those used for growing the liner layers 88A. The precursors used to grow the liner layers 88A, the main layers 88B, and the finishing layers 88C may be the same precursors, or may include different precursors. The growth may be in an ambient such as hydrogen ($H_2$) or the like.

The finishing layers 88C are formed with a greater dopant concentration than the liner layers 88A and a lesser dopant concentration than the main layers 88B. When the epitaxial source/drain regions 88 are formed of an alloy semiconductor (e.g., silicon-germanium), the finishing layers 88C are also formed with a greater concentration of the alloying agent (e.g., germanium) than the liner layers 88A and a lesser concentration of the alloying agent than the main layers 88B. In an embodiment where the epitaxial source/drain regions 88 are boron-doped silicon-germanium (SiGeB), the finishing layers 88C can have a germanium concentration in the range of about 35% to about 55%, and can have a boron concentration in the range of about $5\times10^{20}$ $cm^{-3}$ to about $1\times10^{21}$ $cm^{-3}$. Forming the finishing layers 88C with a dopant concentration that is less than the main layers 88B may help reduce the diffusion of dopants out of the main layers 88B.

After formation, the epitaxial source/drain regions 88 fill the source/drain recesses 100, extend along the sidewalls of the fins 52, and fill the source/drain recesses 102. Referring back to FIG. 5A, less room is available for source/drain regions between the dummy gates 74 as device sizes scale down. By forming the source/drain recesses 102 and allowing the epitaxial source/drain regions 88 to grow in the source/drain recesses 102, the epitaxial source/drain regions 88 can have a greater volume even when the distance between the dummy gates 74 is small. The epitaxial source/drain regions 88 can thus be formed to a greater volume without the risk of merging the epitaxial source/drain regions 88 of adjacent devices.

In the illustrated embodiment, the liner layers 88A, the main layers 88B, and the finishing layers 88C each fill portions of the source/drain recesses 102. Specifically, each of the layers of the epitaxial source/drain regions 88 (e.g., the liner layers 88A, the main layers 88B, and the finishing layers 88C) are grown in the source/drain recesses 100 and the source/drain recesses 102. As such, the liner layers 88A, the main layers 88B, and the finishing layers 88C each extend beneath the top surfaces of the STI regions 56.

In another embodiment, the liner layers 88A and the main layers 88B each fill portions of the source/drain recesses 102, but the finishing layers 88C do not fill the source/drain recesses 102. Specifically, each of the layers of the epitaxial source/drain regions 88 (e.g., the liner layers 88A, the main layers 88B, and the finishing layers 88C) are grown in the source/drain recesses 100, but only a subset of the layers of the epitaxial source/drain regions 88 (e.g., the liner layers 88A and the main layers 88B) are grown in the source/drain recesses 102. As such, the liner layers 88A and the main layers 88B each extend beneath the top surfaces of the STI regions 56, but the finishing layers 88C are disposed over the top surfaces of the STI regions 56.

In yet another embodiment, the liner layers 88A fill all of the source/drain recesses 102, but the main layers 88B and the finishing layers 88C do not fill the source/drain recesses 102. Specifically, each of the layers of the epitaxial source/drain regions 88 (e.g., the liner layers 88A, the main layers 88B, and the finishing layers 88C) are grown in the source/drain recesses 100, but only a subset of the layers of the epitaxial source/drain regions 88 (e.g., the liner layers 88A)

are grown in the source/drain recesses 102. As such, the liner layers 88A extend beneath the top surfaces of the STI regions 56, but the main layers 88B and the finishing layers 88C are each disposed over the top surfaces of the STI regions 56.

The fins 52 (including the portions in which the source/drain recesses 100 are formed) have an overall height $H_1$, which can be in the range of about 40 nm to about 100 nm. The epitaxial source/drain regions 88 have an overall height $H_2$, which can be in the range of about 50 nm to about 120 nm. The height $H_2$ is greater than the height $H_1$, such that the epitaxial source/drain regions 88 are raised above the top surfaces of the fins 52 by a height $H_3$, which can be in the range of about 5 nm to about 30 nm.

The epitaxial source/drain regions 88 have main portions 88M in the source/drain recesses 100 (see FIGS. 10A and 10B). The main portions 88M of the epitaxial source/drain regions 88 have a height which is similar to the depth $D_1$ of the source/drain recesses 100. The depth $D_1$ of the source/drain recesses 100 can be from about 30% to about 80% of the height $H_1$, such as from about 20% to about 50% of the height $H_1$. Forming the source/drain recesses 100 with a depth $D_1$ in this range allows the epitaxial source/drain regions 88 to have sufficient volume (thereby providing enough carriers for the resulting devices), and also allows the epitaxial source/drain regions 88 to be formed with convex top surfaces (thereby allowing the regions to have reduced contact resistance). When the source/drain recesses 100 have a depth $D_1$ that is less than about 30% of the height $H_1$, the epitaxial source/drain regions 88 may not have sufficient volume. When the source/drain recesses 100 have a depth $D_1$ that is greater than about 80% of the height $H_1$, the epitaxial source/drain regions 88 may have top surfaces with other shapes, may be formed to have too great of a width, and too much loss of the fins 52 may occur. When the epitaxial source/drain regions 88 have too great of a width, undesirable merging of the adjacent epitaxial source/drain regions 88 of different devices may occur. When too much loss of the fins 52 occurs, an insufficient amount of strain may be generated in the channel regions 58.

The epitaxial source/drain regions 88 have projecting portions 88P in the source/drain recesses 102 (see FIGS. 10A and 10B). The projecting portions 88P extend into (e.g., beneath the top surfaces of) the STI regions 56, and are disposed on the outer sidewalls of the fins 52. Forming the epitaxial source/drain regions 88 with the projecting portions 88P can reduce the room required for source/drain regions between the dummy gates 74 by up to about 30%. The projecting portions 88P of the epitaxial source/drain regions 88 have a height $H_4$, which can be in the range of about 3 nm to about 20 nm, such as in the range of about 5 nm to about 15 nm. The height $H_4$ of the projecting portions 88P is less than the height of the main portions 88M. The height $H_4$ can be from about 10% to about 20% of the height $H_2$. Forming the projecting portions 88P with a height $H_4$ in this range allows the epitaxial source/drain regions 88 to have sufficient volume (thereby providing enough carriers for the resulting devices), and also allows the epitaxial source/drain regions 88 to be formed with convex top surfaces (thereby allowing the regions to have reduced contact resistance). When the projecting portions 88P have a height $H_4$ that is less than about 10% of the height $H_2$, the epitaxial source/drain regions 88 may not have sufficient volume and/or may have top surfaces with other shapes. When the projecting portions 88P have a height $H_4$ that greater than about 20% of the height $H_2$, diffusion of dopants out of the epitaxial source/drain regions 88 may occur, which may induce short-channel effects in the resulting devices.

The inner fin spacers 98A have a height $H_5$, which can be in the range of about 3 nm to about 30 nm. The portions of the inner sidewalls of the fins 52 that are exposed by the inner fin spacers 98A have a height $H_6$, which can be in the range of about 30 nm to about 80 nm. The height $H_5$ can be from about 20% to about 40% of the height $H_1$, and the height $H_6$ can be from about 40% to about 70% of the height $H_1$. Forming the inner fin spacers 98A with a height $H_5$ in this range allows the epitaxial source/drain regions 88 to have sufficient volume (thereby providing enough carriers for the resulting devices), and also allows the epitaxial source/drain regions 88 to be formed with convex top surfaces (thereby allowing the regions to have reduced contact resistance). When the inner fin spacers 98A have a height $H_5$ that is less than about 20% of the height $H_1$, the epitaxial source/drain regions 88 may have top surfaces with other shapes, and may be formed to have too great of a width. When the inner fin spacers 98A have a height $H_5$ that is greater than about 40% of the height $H_1$, the epitaxial source/drain regions 88 may not have sufficient volume.

As noted above, the inner fin spacers 98A cover portions of the inner sidewalls of the fins 52. As a result, the epitaxial source/drain regions 88 cover more surface area of the outer sidewalls of the fins 52 than the inner sidewalls of the fins 52. More specifically, the epitaxial source/drain regions 88 extend along the inner sidewalls of the fins 52 a first distance (corresponding to the height $H_6$), and the epitaxial source/drain regions 88 extend along the outer sidewalls of the fins 52 by a second distance (corresponding to the sum of the height $H_4$, the height $H_5$, and the height $H_6$), with the first distance being less than the second distance.

Figure 12B:
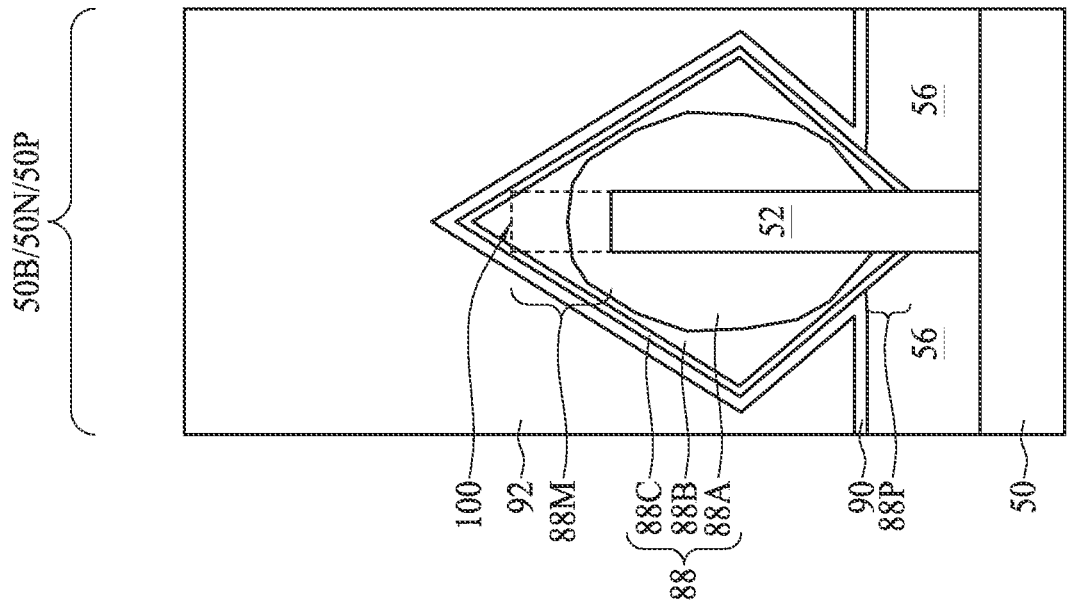
Figure 12A:
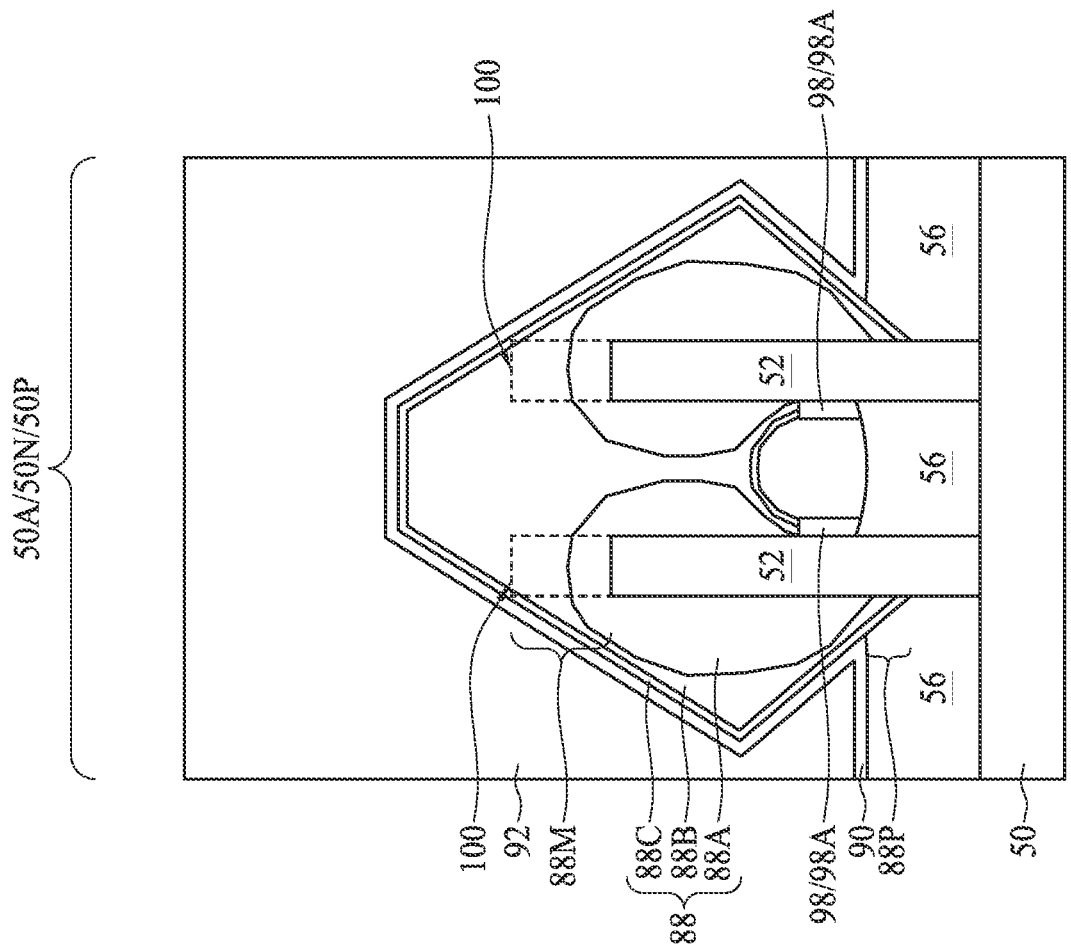

In FIGS. 12A and 12B, the first ILD 92 is deposited over the epitaxial source/drain regions 88, the gate spacers 82, the STI regions 56, and the masks 76 (if present) or the dummy gates 74 (see FIG. 5A). The first ILD 92 may be formed of a dielectric material, and may be deposited by any suitable method, such as CVD, plasma-enhanced CVD (PECVD), or FCVD. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a CESL 90 is formed between the first ILD 92 and the epitaxial source/drain regions 88, the gate spacers 82, the STI regions 56, and the masks 76 (if present) or the dummy gates 74 (see FIG. 5A). The CESL 90 may comprise a dielectric material, such as, silicon nitride, silicon oxide, silicon oxynitride, or the like, having a lower etch rate than the material of the first ILD 92.

Figure 13B:
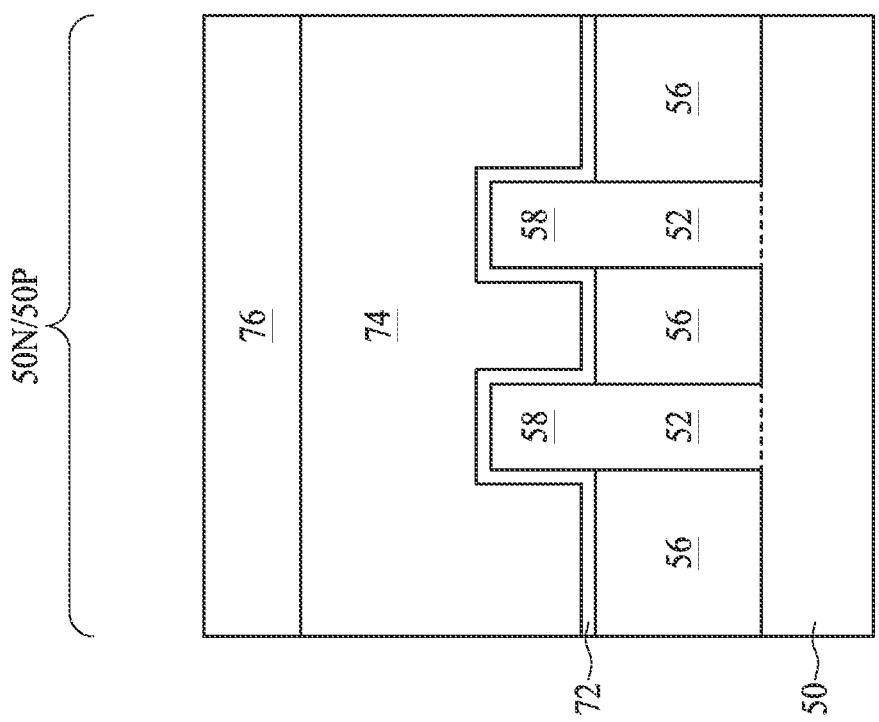
Figure 13A:
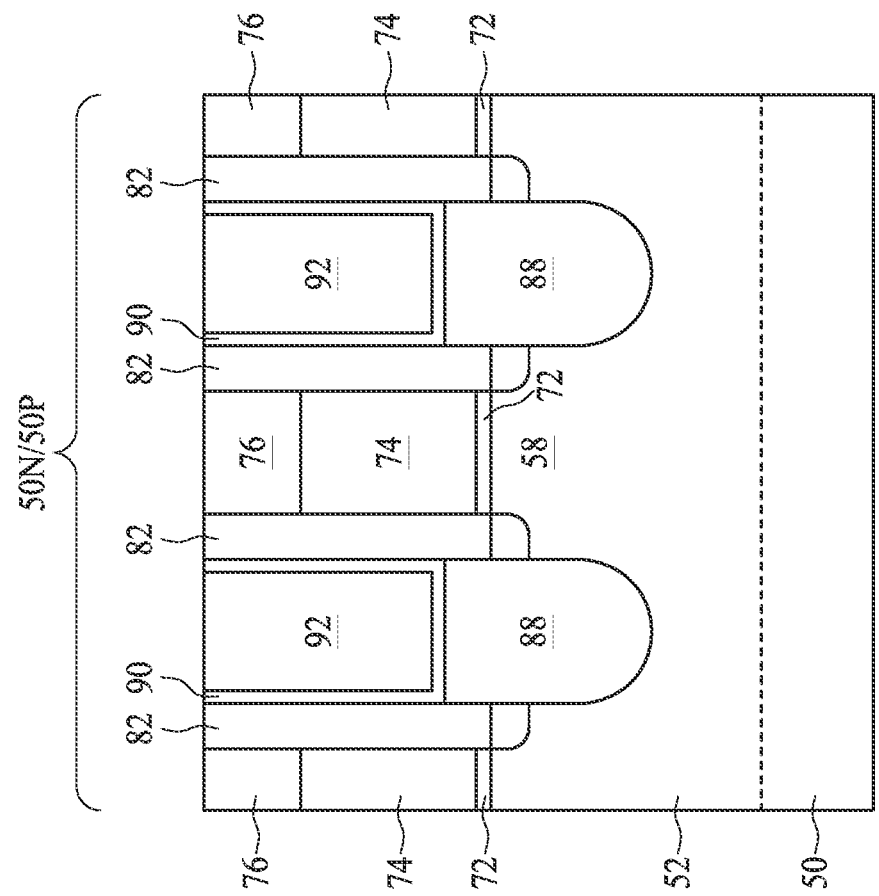

In FIGS. 13A and 13B, a planarization process, such as a CMP, may be performed to level the top surface of the first ILD 92 with the top surfaces of the masks 76 (if present) or the dummy gates 74. The planarization process may also remove the masks 76 on the dummy gates 74, and portions of the gate spacers 82 along sidewalls of the masks 76. After the planarization process, the top surfaces of the dummy gates 74, the gate spacers 82, and the first ILD 92 are coplanar (within process variations). Accordingly, the top surfaces of the dummy gates 74 are exposed through the first ILD 92. In some embodiments, the masks 76 may remain, in which case the planarization process levels the top surface of the first ILD 92 with the top surfaces of the masks 76.

Figure 14B:
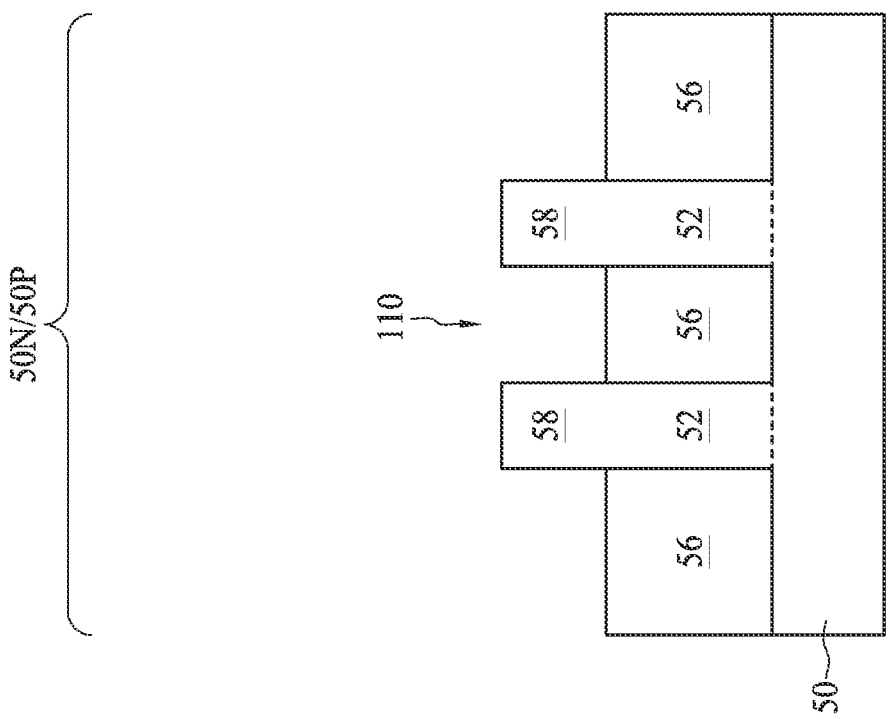
Figure 14A:
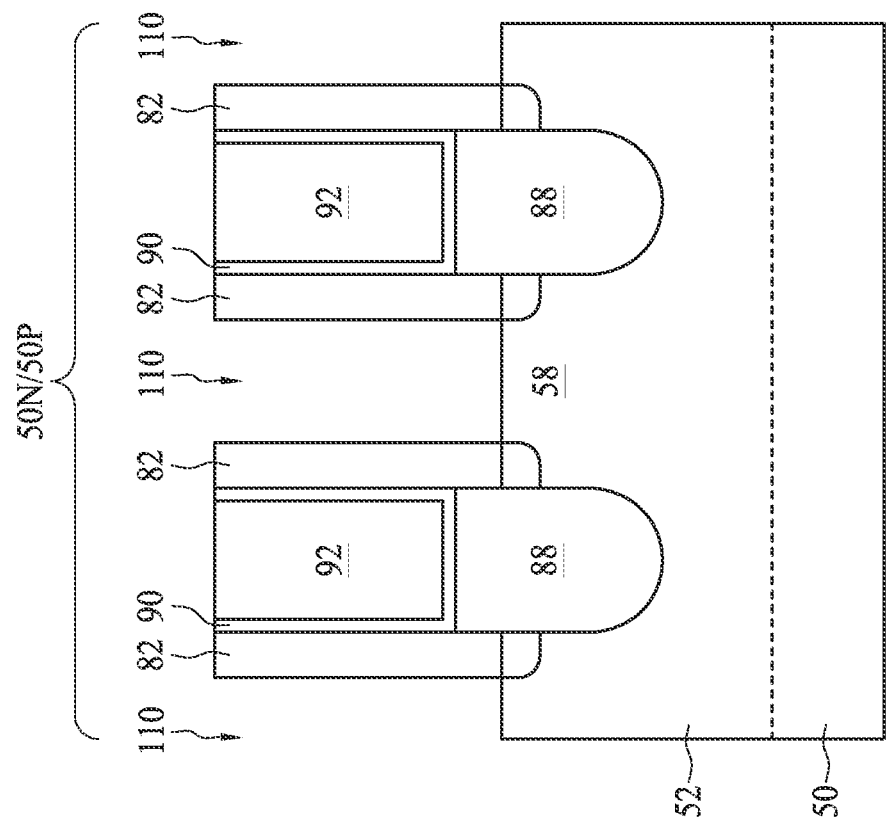

In FIGS. 14A and 14B, the masks 76 (if present) and the dummy gates 74 are removed in one or more etching step(s), so that recesses 110 are formed. Portions of the dummy dielectrics 72 in the recesses 110 may also be removed. In some embodiments, only the dummy gates 74 are removed and the dummy dielectrics 72 remain and are exposed by the recesses 110. In some embodiments, the dummy dielectrics 72 are removed from recesses 110 in a first region of a die (e.g., a core logic region) and remain in recesses 110 in a second region of the die (e.g., an input/output region). In some embodiments, the dummy gates 74 are removed by an anisotropic dry etch process. For example, the etching process may include a dry etch process using reaction gas(es) that selectively etch the dummy gates 74 at a faster rate than the first ILD 92 or the gate spacers 82. Each recess 110 exposes and/or overlies a channel region 58 of a respective fin 52. During the removal, the dummy dielectrics 72 may be used as etch stop layers when the dummy gates 74 are etched. The dummy dielectrics 72 may then be optionally removed after the removal of the dummy gates 74.

In FIGS. 15A and 15B, gate dielectrics 112 and gate electrodes 114 are formed for replacement gates. The gate dielectrics 112 include one or more layers deposited in the recesses 110, such as on the top surfaces and the sidewalls of the fins 52 and on sidewalls of the gate spacers 82. In some embodiments, the gate dielectrics 112 comprise one or more dielectric layers, such as one or more layers of silicon oxide, silicon nitride, metal oxide, metal silicate, or the like. For example, in some embodiments, the gate dielectrics 112 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectrics 112 may include a dielectric layer having a k-value greater than about 7.0. The formation methods of the gate dielectrics 112 may include Molecular-Beam Deposition (MBD), ALD, PECVD, and the like. In embodiments where portions of the dummy dielectrics 72 remain in the recesses 110, the gate dielectrics 112 include a material of the dummy dielectrics 72 (e.g., silicon oxide).

The gate electrodes 114 are deposited over the gate dielectrics 112, respectively, and fill the remaining portions of the recesses 110. The gate electrodes 114 may include a metal-containing material such as titanium nitride, titanium oxide, tantalum nitride, tantalum carbide, cobalt, ruthenium, aluminum, tungsten, combinations thereof, or multi-layers thereof. For example, although single layered gate electrodes 114 are illustrated, the gate electrodes 114 may include any number of liner layers, any number of work function tuning layers, and a fill material. After the filling of the recesses 110, a planarization process, such as a CMP, may be performed to remove the excess portions of the materials of the gate dielectrics 112 and the gate electrodes 114, which excess portions are over the top surfaces of the first ILD 92. The top surfaces of the gate spacers 82, the first ILD 92, the gate dielectrics 112, and the gate electrodes 114 are thus coplanar (within process variations). The remaining portions of the materials of the gate dielectrics 112 and the gate electrodes 114 thus form replacement gates of the resulting FinFETs. The gate dielectrics 112 and the gate electrodes 114 may each be collectively referred to as a "gate structure." The gate structures each extend along sidewalls of a channel region 58 of the fins 52.

The formation of the gate dielectrics 112 in the n-type region 50N and the p-type region 50P may occur simultaneously such that the gate dielectrics 112 in each region are formed of the same materials, and the formation of the gate electrodes 114 may occur simultaneously such that the gate electrodes 114 in each region are formed of the same materials. In some embodiments, the gate dielectrics 112 in each region may be formed by distinct processes, such that the gate dielectrics 112 may be different materials, and/or the gate electrodes 114 in each region may be formed by distinct processes, such that the gate electrodes 114 may be different materials. Various masking steps may be used to mask and expose appropriate regions when using distinct processes.

Figure 16B:
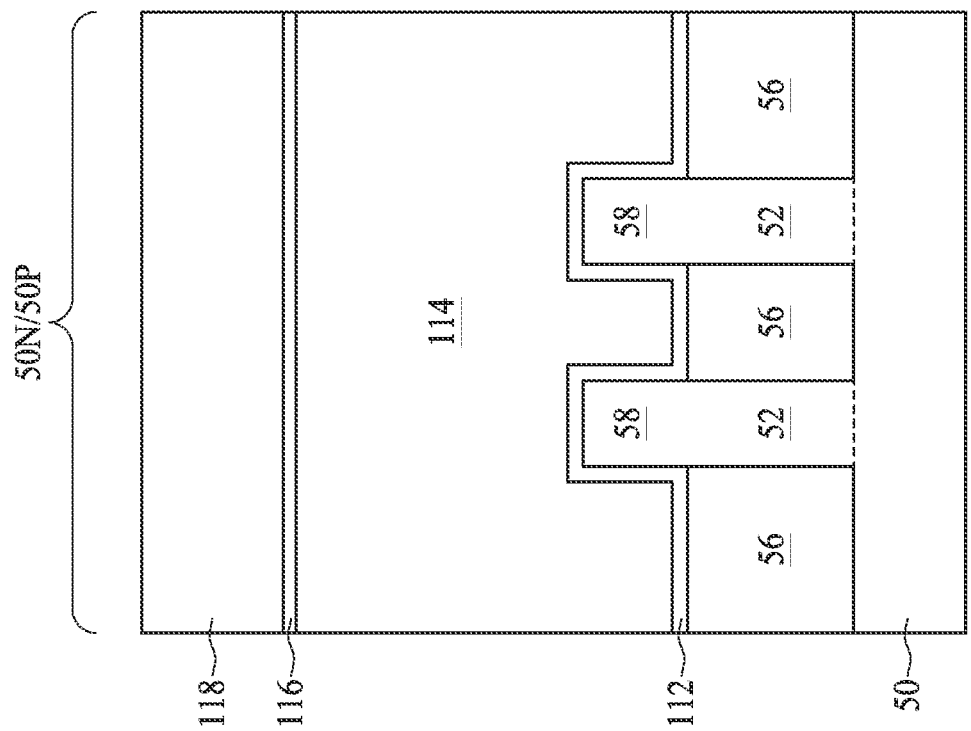
Figure 16A:
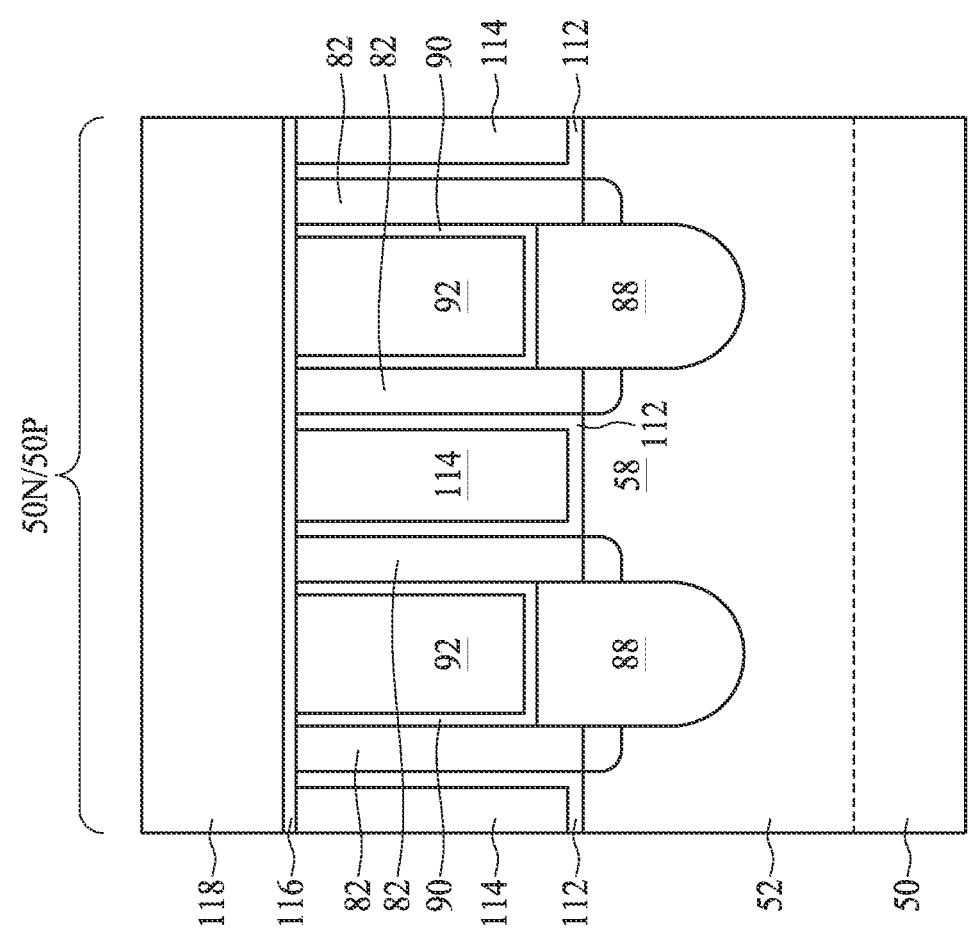

In FIGS. 16A and 16B, a second ILD 118 is deposited over the gate spacers 82, the first ILD 92, the gate dielectrics 112, and the gate electrodes 114. In some embodiments, the second ILD 118 is a flowable film formed by a flowable CVD method. In some embodiments, the second ILD 118 is formed of a dielectric material such as PSG, BSG, BPSG, USG, or the like, and may be deposited by any suitable method, such as CVD and PECVD.

In some embodiments, an etch stop layer (ESL) 116 is formed between the second ILD 118 and the gate spacers 82, the first ILD 92, the gate dielectrics 112, and the gate electrodes 114. The ESL 116 may comprise a dielectric material, such as, silicon nitride, silicon oxide, silicon oxynitride, or the like, having a lower etch rate than the material of the second ILD 118.

Figure 17A:
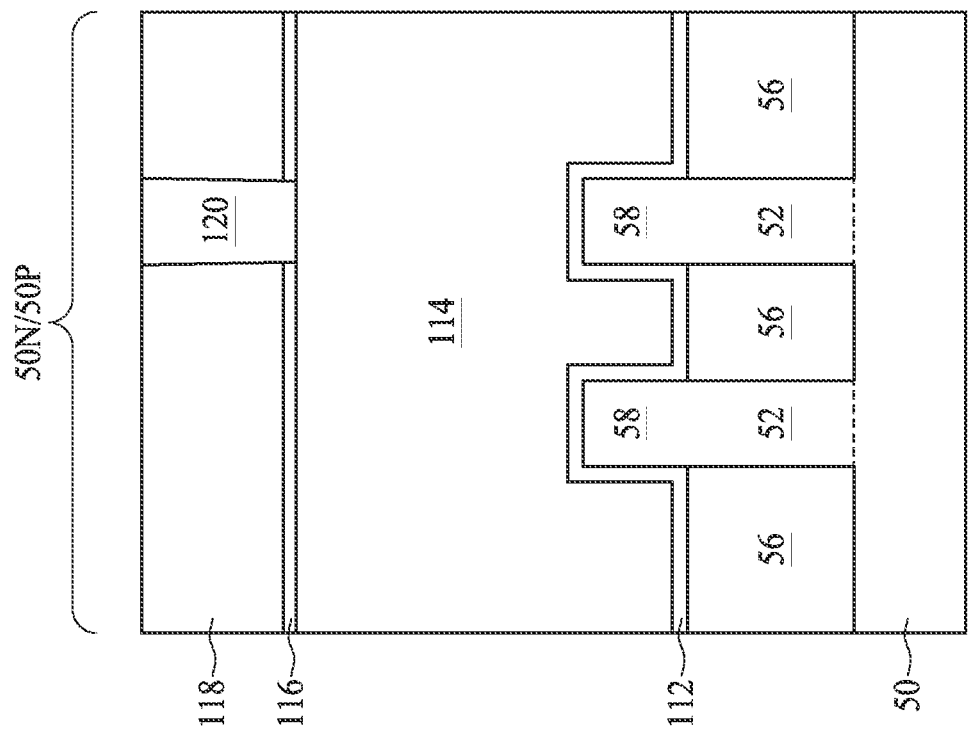
Figure 17B:
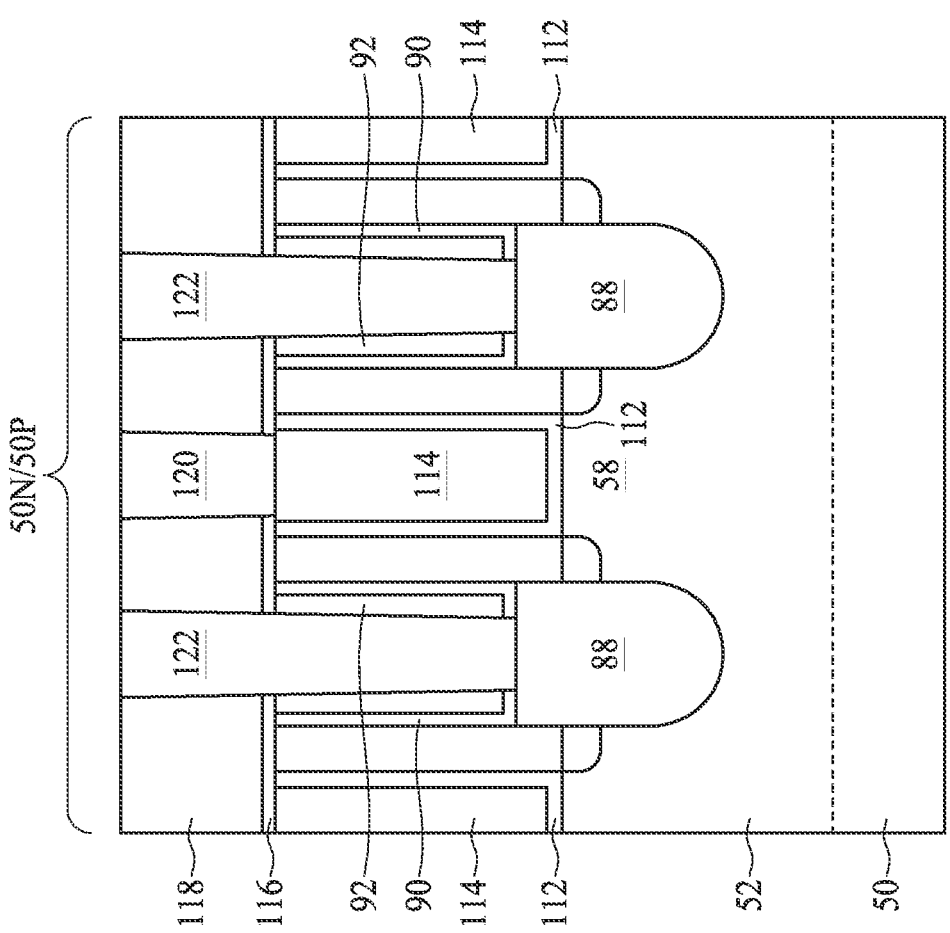

In FIGS. 17A and 17B, gate contacts 120 and source/drain contacts 122 are formed to contact, respectively, the gate electrodes 114 and the epitaxial source/drain regions 88. The gate contacts 120 are physically and electrically coupled to the gate electrodes 114, and the source/drain contacts 122 are physically and electrically coupled to the epitaxial source/drain regions 88.

As an example to form the gate contacts 120, openings for the gate contacts 120 are formed through the second ILD 118 and the ESL 116. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 118. The remaining liner and conductive material form the gate contacts 120 in the openings.

Figure 18B:
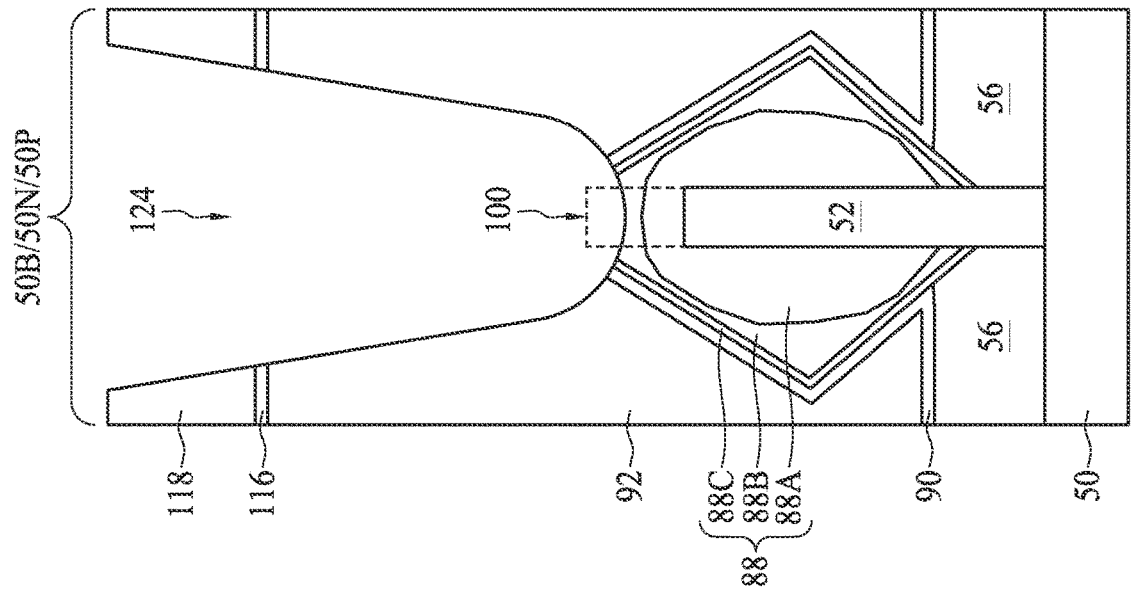
Figure 18A:
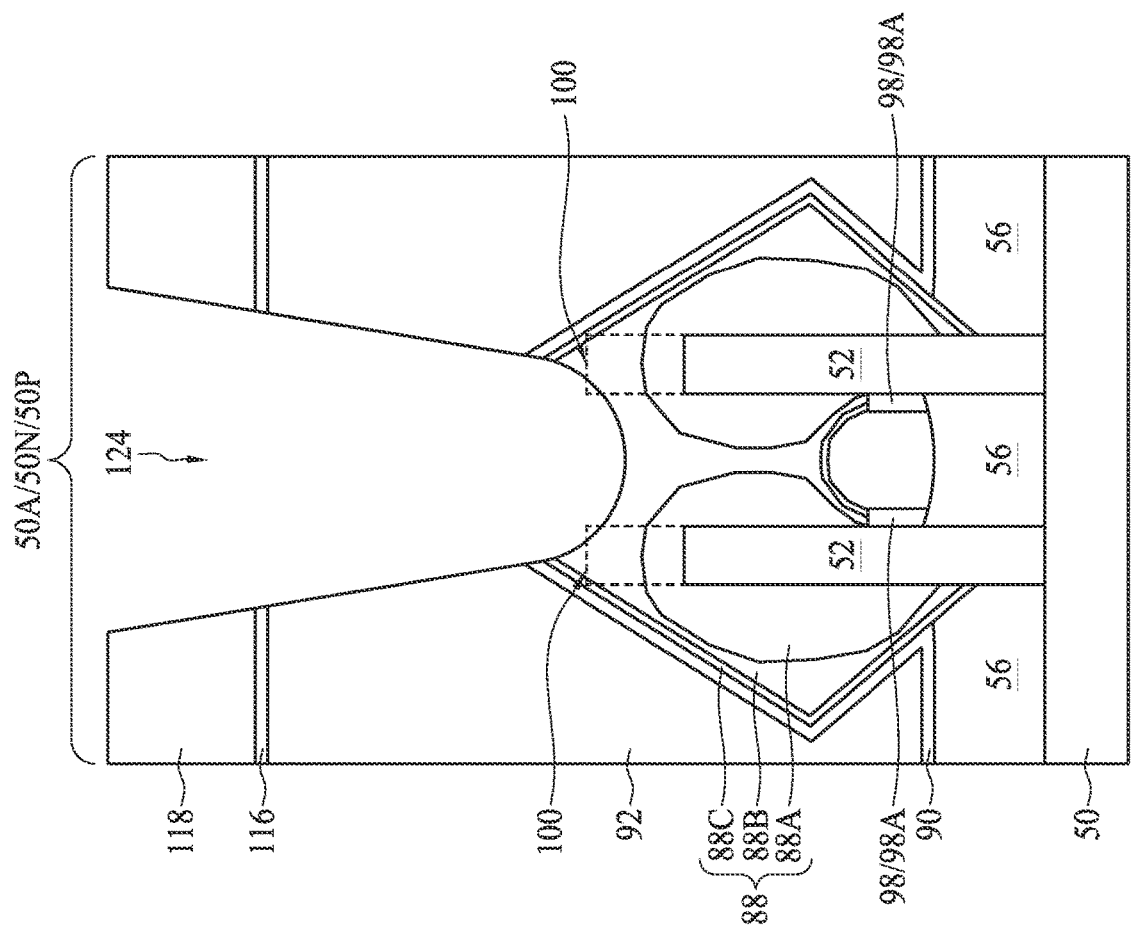

FIGS. 18A through 19B illustrate various steps in the manufacturing of embodiment devices. Specifically, the formation of the source/drain contacts 122 is illustrated. FIGS. 18A and 19A illustrate a first region 50A and FIGS. 18B and 19B illustrate a second region 50B, in a similar manner as FIGS. 6A through 12B.

In FIGS. 18A and 18B, openings 124 for the source/drain contacts 122 are formed through the second ILD 118, the ESL 116, the first ILD 92, and the CESL 90. The openings 124 may be formed using acceptable photolithography and etching techniques. The openings 124 are also formed through the finishing layers 88C of the epitaxial source/drain regions 88, and may extend into the main layers 88B of the epitaxial source/drain regions 88. More specifically, the openings 124 extend into the source/drain recesses 100, and below the top surfaces of the fins 52. For example, the openings 124 can extend into the epitaxial source/drain regions 88 by a depth in the range of about 5 nm to about 10 nm.

In FIGS. 19A and 19B, the source/drain contacts 122 are formed in the openings 124. A liner (not shown), such as a diffusion barrier layer, an adhesion layer, or the like, and a conductive material are formed in the openings 124. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 118. The remaining liner and conductive material form the source/drain contacts 122 in the openings 124.

Optionally, metal-semiconductor alloy regions 126 are formed at the interface between the epitaxial source/drain regions 88 and the source/drain contacts 122. The metal-semiconductor alloy regions 126 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 126 can be formed before the source/drain contacts 122 by depositing a metal in the openings 124 and then performing a thermal anneal process. The metal can be any metal capable of reacting with the semiconductor materials (e.g., silicon, silicon-germanium, germanium, etc.) of the epitaxial source/drain regions 88 to form a low-resistance metal-semiconductor alloy, such as nickel, cobalt, titanium, tantalum, platinum, tungsten, other noble metals, other refractory metals, rare earth metals or their alloys. The metal can be deposited by a deposition process such as ALD, CVD, PVD, or the like, and can be deposited to a thickness in the range of about 1 nm to about 10 nm. Impurities can be implanted in the metal to accelerate formation of the metal-semiconductor alloy regions 126 during the thermal anneal process. The impurities can also help activate the p-type and/or n-type impurities in the epitaxial source/drain regions 88 during the thermal anneal process, helping reduce the contact resistance to the resulting devices. For example, a semiconductor impurity such as germanium may be implanted in the metal. In an embodiment, the metal-semiconductor alloy regions 126 are silicide regions formed of germanium-doped titanium-silicon. After the thermal anneal process, a cleaning process, such as a wet clean, may be performed to remove any residual metal from the openings 124, such as from surfaces of the metal-semiconductor alloy regions 126. The source/drain contacts 122 can then be formed in the remaining portions of the openings 124 and on the metal-semiconductor alloy regions 126.

Although they are described as being formed in separate processes, the gate contacts 120 and the source/drain contacts 122 may also be formed in the same process. For example, openings for the gate contacts 120 and the source/drain contacts 122 may be formed together, and then filled by the deposition process(es) used to form the material(s) of the gate contacts 120 and the source/drain contacts 122. Further, although shown as being formed in the same cross-sections (see FIG. 5A), it should be appreciated that each of the gate contacts 120 and the source/drain contacts 122 may be formed in different cross-sections, which may avoid shorting of the contacts.

Figure 20B:
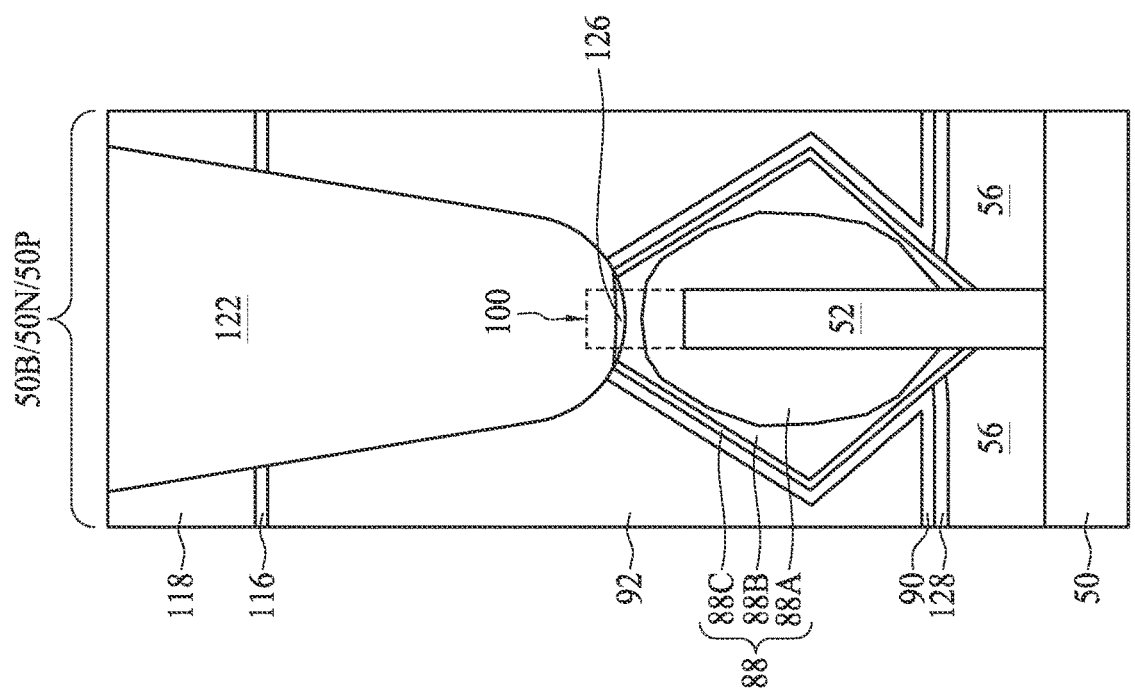
FIGS. 20A and 20B are views of FinFETs, in accordance with some other embodiments.
Figure 20A:
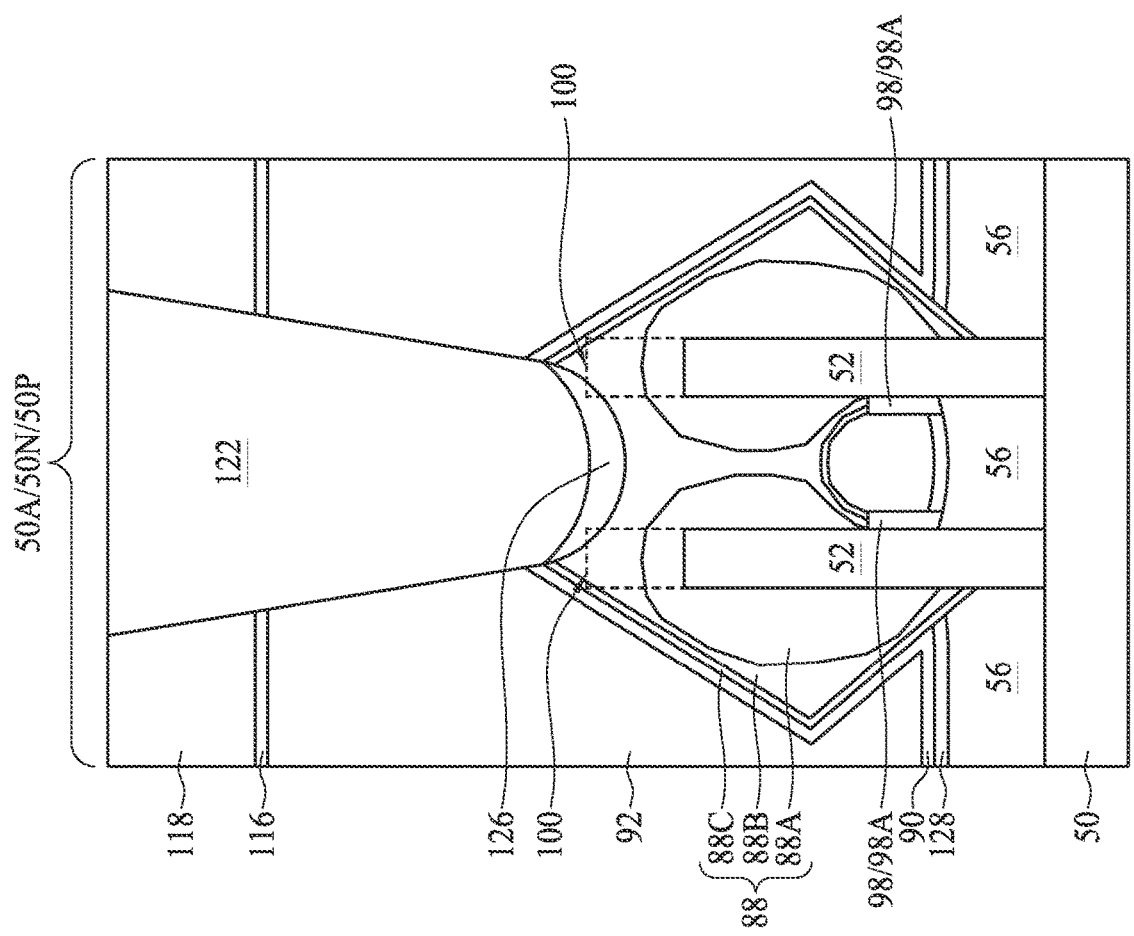

FIGS. 20A and 20B are views of FinFETs, in accordance with some other embodiments. This embodiment is similar to the embodiment of FIGS. 19A and 19B, except dielectric layers 128 are disposed over the STI regions 56 and between the fin spacers 98. The dielectric layers 128 may be formed of an oxide such as silicon oxide, a nitride such as silicon nitride, the like, or a combination thereof, which may be deposited by CVD, ALD, or the like. As an example to form the dielectric layers 128, a dielectric material may be deposited after the fin spacers 98 are patterned. The dielectric material may then be recessed so that the remaining portions of the dielectric material are disposed between the fin spacers 98. The dielectric material may be recessed by any acceptable etch process. The dielectric material, when etched, has portions left on the top surfaces of the STI regions 56 (hence forming the dielectric layers 128). In some embodiments, the dielectric layers 128 are formed of a similar material as the STI regions 56, but may be formed by a different process than the material of the STI regions 56. For example, the dielectric layers 128 may include silicon oxide formed by CVD, which allows for deposition of a higher quality film than FCVD. The dielectric layers 128 can thus provide additional separation of the features of adjacent devices.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate structures and source/drain regions are formed in a manner similar to the above-described embodiments. After the dummy gate structures are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Embodiments may achieve advantages. Forming the source/drain recesses 102 in the STI regions 56 and growing the epitaxial source/drain regions 88 in the source/drain recesses 102 allows the epitaxial source/drain regions 88 to be formed to a greater volume than epitaxial source/drain regions that are not grown in the source/drain recesses 102. Specifically, the source/drain recesses 102 provide additional room in which the epitaxial source/drain regions 88 may be grown. Further, forming the epitaxial source/drain regions 88 in the source/drain recesses 102 allows the source/drain recesses 100 to be formed to a lesser depth $D_1$, thereby reducing loss of the fins 52 during source/drain formation. When less loss of the fins 52 occurs, a greater amount of strain may be generated in the channel regions 58 by the epitaxial source/drain regions 88.

An embodiment device includes: an isolation region on a substrate; a first fin extending above a top surface of the isolation region; a gate structure on the first fin; and an epitaxial source/drain region adjacent the gate structure, the epitaxial source/drain region having a first main portion and a first projecting portion, the first main portion disposed in the first fin, the first projecting portion disposed on a first sidewall of the first fin and beneath the top surface of the isolation region. In some embodiments of the device, a height of the first main portion of the epitaxial source/drain region is from 30% to 80% of an overall height of the first fin. In some embodiments of the device, a height of the first projecting portion of the epitaxial source/drain region is from 10% to 20% of an overall height of the epitaxial source/drain region. In some embodiments of the device, the epitaxial source/drain region includes: a liner layer on the first fin, the liner layer including boron-doped silicon-germanium having a first germanium concentration and a first boron concentration; a main layer on the liner layer, the main layer including boron-doped silicon-germanium having a second germanium concentration and a second boron concentration; and a finishing layer on the main layer, the finishing layer including boron-doped silicon-germanium having a third germanium concentration and a third boron concentration, the third germanium concentration less than the second germanium concentration and greater than the first germanium concentration, the third boron concentration less than the second boron concentration and greater than the first boron concentration. In some embodiments of the device, the liner layer extends beneath the top surface of the isolation region, and the main layer and the finishing layer are disposed over the top surface of the isolation region. In some embodiments of the device, the liner layer and the main layer extend beneath the top surface of the isolation region, and the finishing layer is disposed over the top surface of the isolation region. In some embodiments of the device, the liner layer, the main layer, and the finishing layer extend beneath the top surface of the isolation region. In some embodiments, the device further includes: a second fin extending above the top surface of the isolation region, where the gate structure is on the second fin, and where the epitaxial source/drain region further has a second main portion and a second projecting portion, the second main portion disposed in the second fin, the second projecting portion disposed on a second sidewall of the second fin and beneath the top surface of the isolation region, the first sidewall of the first fin and the second sidewall of the second fin facing away from one another.

An embodiment device includes: an isolation region on a substrate; a first fin extending above a top surface of the isolation region, the first fin having a first inner sidewall and a first outer sidewall; a second fin extending above the top surface of the isolation region, the second fin having a second inner sidewall and a second outer sidewall, the first inner sidewall and the second inner sidewall facing one another; and an epitaxial source/drain region in the first fin and the second fin, the epitaxial source/drain region extending a first distance along the first inner sidewall and the second inner sidewall, the epitaxial source/drain region extending a second distance along the first outer sidewall and the second outer sidewall, the first distance less than the second distance. In some embodiments, the device further includes: a first fin spacer disposed on the first inner sidewall of the first fin; and a second fin spacer disposed on the second inner sidewall of the second fin. In some embodiments of the device, the epitaxial source/drain region extends beneath the top surface of the isolation region. In some embodiments of the device, the epitaxial source/drain region has a convex top surface.

An embodiment method includes: depositing a spacer layer on fins, the fins extending from an isolation region; patterning the spacer layer to form inner fin spacers and outer fin spacers, the inner fin spacers disposed on inner sidewalls of the fins, the outer fin spacers disposed on outer sidewalls of the fins; patterning first source/drain recesses in the fins; after patterning the first source/drain recesses, performing a plasma etching process to recess the inner fin spacers, remove the outer fin spacers, and form second source/drain recesses in the isolation region beneath the outer fin spacers; and growing an epitaxial source/drain region in the first source/drain recesses and the second source/drain recesses. In some embodiments of the method, the plasma etching process etches the outer fin spacers at a faster rate than the inner fin spacers. In some embodiments of the method, the spacer layer is formed of silicon oxycarbonitride, and the plasma etching process is an anisotropic etch performed with CF4 at bias voltage in a range of 300 volts to 500 volts. In some embodiments of the method, a depth of the first source/drain recesses is from 30% to 80% of an overall height of the fins. In some embodiments of the method, a depth of the second source/drain recesses is from 10% to 20% of an overall height of the epitaxial source/drain region. In some embodiments of the method, growing the epitaxial source/drain region includes growing a plurality of layers, each of the layers grown in the first source/drain recesses, a subset of the layers grown in the second source/drain recesses. In some embodiments of the method, growing the epitaxial source/drain region includes growing a plurality of layers, each of the layers grown in the first source/drain recesses, each of the layers grown in the second source/drain recesses. In some embodiments of the method, portions of the epitaxial source/drain region between the fins are separated from the isolation region by the inner fin spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   an isolation region on a substrate;
   a first fin extending above a top surface of the isolation region;
   a gate structure on the first fin; and
   an epitaxial source/drain region adjacent the gate structure, the epitaxial source/drain region having a first main portion and a first projecting portion, the first main portion disposed in the first fin, the first projecting portion disposed on a first sidewall of the first fin and beneath the top surface of the isolation region.

2. The device of claim 1, wherein a height of the first main portion of the epitaxial source/drain region is from 30% to 80% of an overall height of the first fin.

3. The device of claim 1, wherein a height of the first projecting portion of the epitaxial source/drain region is from 10% to 20% of an overall height of the epitaxial source/drain region.

4. The device of claim 1, wherein the epitaxial source/drain region comprises:
   a liner layer on the first fin, the liner layer comprising boron-doped silicon-germanium having a first germanium concentration and a first boron concentration;
   a main layer on the liner layer, the main layer comprising boron-doped silicon-germanium having a second germanium concentration and a second boron concentration; and
   a finishing layer on the main layer, the finishing layer comprising boron-doped silicon-germanium having a third germanium concentration and a third boron concentration, the third germanium concentration less than the second germanium concentration and greater than the first germanium concentration, the third boron concentration less than the second boron concentration and greater than the first boron concentration.

5. The device of claim 4, wherein the liner layer extends beneath the top surface of the isolation region, and wherein the main layer and the finishing layer are disposed over the top surface of the isolation region.

6. The device of claim 4, wherein the liner layer and the main layer extend beneath the top surface of the isolation region, and wherein the finishing layer is disposed over the top surface of the isolation region.

7. The device of claim 4, wherein the liner layer, the main layer, and the finishing layer extend beneath the top surface of the isolation region.

8. The device of claim 1 further comprising:
a second fin extending above the top surface of the isolation region,
wherein the gate structure is on the second fin, and
wherein the epitaxial source/drain region further has a second main portion and a second projecting portion, the second main portion disposed in the second fin, the second projecting portion disposed on a second sidewall of the second fin and beneath the top surface of the isolation region, the first sidewall of the first fin and the second sidewall of the second fin facing away from one another.

9. A device comprising:
an isolation region on a substrate;
a first fin extending above a top surface of the isolation region, the first fin having a first inner sidewall and a first outer sidewall;
a second fin extending above the top surface of the isolation region, the second fin having a second inner sidewall and a second outer sidewall, the first inner sidewall and the second inner sidewall facing one another; and
an epitaxial source/drain region in the first fin and the second fin, the epitaxial source/drain region extending a first distance along the first inner sidewall and the second inner sidewall, the epitaxial source/drain region extending a second distance along the first outer sidewall and the second outer sidewall, the first distance less than the second distance.

10. The device of claim 9 further comprising:
a first fin spacer disposed on the first inner sidewall of the first fin; and
a second fin spacer disposed on the second inner sidewall of the second fin.

11. The device of claim 9, wherein the epitaxial source/drain region extends beneath the top surface of the isolation region.

12. The device of claim 9, wherein the epitaxial source/drain region has a convex top surface.

13. A method comprising:
depositing a spacer layer on fins, the fins extending from an isolation region;
patterning the spacer layer to form inner fin spacers and outer fin spacers, the inner fin spacers disposed on inner sidewalls of the fins, the outer fin spacers disposed on outer sidewalls of the fins;
patterning first source/drain recesses in the fins;
after patterning the first source/drain recesses, performing a plasma etching process to recess the inner fin spacers, remove the outer fin spacers, and form second source/drain recesses in the isolation region beneath the outer fin spacers; and
growing an epitaxial source/drain region in the first source/drain recesses and the second source/drain recesses.

14. The method of claim 13, wherein the plasma etching process etches the outer fin spacers at a faster rate than the inner fin spacers.

15. The method of claim 14, wherein the spacer layer is formed of silicon oxycarbonitride, and the plasma etching process is an anisotropic etch performed with $CF_4$ at bias voltage in a range of 300 volts to 500 volts.

16. The method of claim 13, wherein a depth of the first source/drain recesses is from 30% to 80% of an overall height of the fins.

17. The method of claim 13, wherein a depth of the second source/drain recesses is from 10% to 20% of an overall height of the epitaxial source/drain region.

18. The method of claim 13, wherein growing the epitaxial source/drain region comprises growing a plurality of layers, each of the layers grown in the first source/drain recesses, a subset of the layers grown in the second source/drain recesses.

19. The method of claim 13, wherein growing the epitaxial source/drain region comprises growing a plurality of layers, each of the layers grown in the first source/drain recesses, each of the layers grown in the second source/drain recesses.

20. The method of claim 13, wherein portions of the epitaxial source/drain region between the fins are separated from the isolation region by the inner fin spacers.

* * * * *